US009859133B2

(12) United States Patent
Kasai et al.

(10) Patent No.: US 9,859,133 B2
(45) Date of Patent: Jan. 2, 2018

(54) MOLD RELEASE FILM AND PROCESS FOR PRODUCING SEMICONDUCTOR PACKAGE

(71) Applicant: Asahi Glass Company, Limited, Chiyoda-ku (JP)

(72) Inventors: Wataru Kasai, Chiyoda-ku (JP); Masami Suzuki, Chiyoda-ku (JP)

(73) Assignee: Asahi Glass Company, Limited, Chiyoda-ku (JP)

( * ) Notice: Subject to any disclaimer, the term of this patent is extended or adjusted under 35 U.S.C. 154(b) by 0 days.

(21) Appl. No.: 15/061,044

(22) Filed: Mar. 4, 2016

(65) Prior Publication Data

US 2016/0189985 A1 Jun. 30, 2016

Related U.S. Application Data

(63) Continuation of application No. PCT/JP2014/079591, filed on Nov. 7, 2014.

(30) Foreign Application Priority Data

Nov. 7, 2013 (JP) .................................. 2013-231364
Nov. 7, 2013 (JP) .................................. 2013-231365

(51) Int. Cl.
*H01L 21/56* (2006.01)
*H01L 23/00* (2006.01)
(Continued)

(52) U.S. Cl.
CPC ............ *H01L 21/566* (2013.01); *B29C 33/68* (2013.01); *C08F 214/265* (2013.01); *C08J 5/18* (2013.01);
(Continued)

(58) Field of Classification Search
None
See application file for complete search history.

(56) References Cited

U.S. PATENT DOCUMENTS 5,173,766 A * 12/1992 Long ..................... H01L 21/50
257/668
2009/0281250 A1* 11/2009 Desimone ......... B01L 3/502707
525/418
(Continued)

FOREIGN PATENT DOCUMENTS

JP 2803744 9/1998
JP 2000-252309 9/2000
(Continued)

OTHER PUBLICATIONS

International Search Report dated Dec. 22, 2014 in PCT/JP 2014/079591, filed on Nov. 7, 2014.

Primary Examiner — William Coleman
Assistant Examiner — Kien Ly
(74) Attorney, Agent, or Firm — Oblon, McClelland, Maier & Neustadt, L.L.P.

(57) ABSTRACT

A mold release film, which is excellent in releasability and capable of suppressing contamination of a mold or a resin-encapsulation portion by the mold release film and forming a resin-encapsulation portion excellent in adhesion to an ink layer, is provided. The mold release film is disposed on a cavity surface of a mold, in which a semiconductor element is disposed and encapsulated with a curable resin to form a resin-encapsulation portion. The mold release film has a first surface in contact with the curable resin when the resin-encapsulation portion is formed, and a second surface in contact with the cavity surface. At least the first surface is made of a fluororesin. The mold release film has an F/Al ratio of from 0.2 to 4, or an F/(C+F+O) ratio of from 0.1 to 0.3. A process for producing a semiconductor package using the mold release film is also provided.

18 Claims, 5 Drawing Sheets

(51) Int. Cl.
  *H01L 23/31*   (2006.01)
  *B29C 33/68*   (2006.01)
  *C08F 214/26*  (2006.01)
  *C08J 5/18*    (2006.01)
  *B29L 31/34*   (2006.01)

(52) U.S. Cl.
  CPC ....... *H01L 24/97* (2013.01); *B29L 2031/3406* (2013.01); *H01L 23/3121* (2013.01); *H01L 2224/48091* (2013.01); *H01L 2224/48227* (2013.01); *H01L 2924/181* (2013.01)

(56) References Cited

U.S. PATENT DOCUMENTS

| | | | |
|---|---|---|---|
| 2011/0254201 A1 | 10/2011 | Higuchi et al. | |
| 2012/0095151 A1* | 4/2012 | Terada | C08L 15/02 |
| | | | 524/495 |
| 2012/0148820 A1* | 6/2012 | Okuya | B29C 33/68 |
| | | | 428/220 |
| 2012/0232207 A1* | 9/2012 | Iruya | B82Y 30/00 |
| | | | 524/445 |
| 2014/0001661 A1 | 1/2014 | Higuchi et al. | |

FOREIGN PATENT DOCUMENTS

| | | |
|---|---|---|
| JP | 3970464 | 9/2007 |
| JP | 2011-44565 | 3/2011 |
| WO | WO 2007/125834 A1 | 11/2007 |
| WO | WO 2008/020543 A1 | 2/2008 |
| WO | WO 2010/079812 A1 | 7/2010 |
| WO | WO 2013/115187 A1 | 8/2013 |

* cited by examiner

MOLD RELEASE FILM AND PROCESS FOR PRODUCING SEMICONDUCTOR PACKAGE

TECHNICAL FIELD

The present invention relates to a mold release film to be disposed on a cavity surface of a mold in a method for producing a semiconductor package wherein a semiconductor element is disposed in a mold and encapsulated with a curable resin to form a resin-encapsulation portion, and a process for producing a semiconductor package by using the mold release film.

BACKGROUND ART

A semiconductor package has a resin-encapsulation portion to protect a semiconductor element. For formation of the resin-encapsulation portion (for encapsulation of a semiconductor element), a curable resin e.g. a thermosetting resin such as an epoxy resin is used.

As a method for producing a semiconductor package, for example, a method comprising an encapsulating step by a so-called compression molding method or transfer molding method is known, wherein a substrate having a semiconductor element mounted thereon, is disposed so that the semiconductor element is located at a predetermined position in the cavity of a mold, and a curable resin is filled in the cavity to form a resin-encapsulation portion. In such a method, in order to improve releasability by preventing adhesion of the encapsulation resin and the mold in the encapsulation step, such a measure has been adopted that a mold release agent is blended to the curable resin, or a mold release film is disposed on the cavity surface of the mold.

In the step of encapsulating the semiconductor element, even if a mold release film is disposed, there is a problem such that a gas generated from the curable resin (outgas) or a low-viscosity substance is transmitted through the mold release film and gets in contact with a high temperature mold to contaminate the mold. Further, the disposition of a mold release film on the cavity surface of the mold is carried out by letting the mold release film be adsorbed and held to the cavity surface by vacuuming, whereby volatile components such as oligomers in the mold release film are likely to migrate to the mold side to cause mold contamination. If mold contamination occurs, it is inevitable to pause the step of encapsulating the semiconductor element in order to clean the mold, whereby the production efficiency for the semiconductor package is reduced.

To overcome such problems, the following mold release films (1) and (2) have been proposed (Patent Documents 1 and 2).

(1) a gas barrier semiconductor resin mold release film comprising a release layer excellent in releasability and a plastic support layer for supporting it, wherein the strength at 200% elongation at 170° C., of the plastic support layer is from 1 to 50 MPa, and the xylene gas permeability at 170° C. is at most $5\times10^{-15}$ (kmol·m/(s·m$^2$·kPa)).

(2) a gas barrier semiconductor resin mold release film comprising a release layer excellent in releasability, a plastic support layer for supporting it, and a gas permeation inhibiting layer made of a metal or a metal oxide, which is formed between the release layer and the support layer, wherein the xylene gas permeability at 170° C. is at most $5\times10^{-15}$ (kmol·m/(s·m$^2$·kPa)).

The mold release films (1) and (2) are said to be able to reduce mold contamination due to outgassing and low viscosity material, since the xylene gas permeability is at most $5\times10^{-15}$ (kmol·m/(s·m$^2$·Pa)).

In the mold release films (1) and (2), a release layer is provided at least on the surface to be in contact with a mold resin injected into the mold, in order to impart sufficient releasability to the mold resin (resin-encapsulation portion) after curing. As such a release layer, a layer made of a fluororesin is used.

Further, in the production of a semiconductor package, in order to display information of the product number, manufacturers, etc., it is common to form an ink layer on the surface of the formed resin-encapsulation portion by printing with an ink.

However, if a release agent is blended to the curable resin, since the release agent will be present at the surface of the resin-encapsulation portion to be formed, adhesion between the resin-encapsulation portion and the ink layer tends to be low, whereby there will be a problem such that with time, the ink layer tends to be peeled off from the resin-encapsulation portion. Therefore, it is necessary to prevent the reduction in adhesion by applying some treatment (for example, Patent Document 3), which leads to an increase of process steps.

In a case where without blending a release agent to the curable resin, a mold release film is disposed on the cavity surface of a mold, no problem due to a release agent arises, but the adhesion between the resin-encapsulation portion and the ink layer may still not be sufficient.

In order to improve the adhesion between the resin-encapsulation portion and the ink layer, it has been proposed to use a mold release film having its surface roughness increased by forming irregularities on the surface, and to form a resin-encapsulation portion by disposing the mold release film in a mold so that the irregularities face the curable resin side (for example, Patent Document 4). In this case, the irregularities of the mold release film surface are transferred to the surface of the resin-encapsulation portion. By the presence of such irregularities, the adhesion of the ink layer to the resin-encapsulation portion will be improved.

The mold release film is required to have, in addition to releasability, heat resistance to withstand the temperature of the mold during molding, strength to withstand the pressing force or the flow of the encapsulation resin, etc. It has been proposed to use a fluororesin film as a mold release film, since it is excellent in these properties (for example, Patent Document 5).

PRIOR ART DOCUMENTS

Patent Documents

Patent Document 1: WO2007/125834
Patent Document 2: WO2008/020543
Patent Document 3: Japanese Patent No. 2803744
Patent Document 4: Japanese Patent No. 3970464
Patent Document 5: WO2010/079812

DISCLOSURE OF INVENTION

Technical Problem

The present inventors have found that the fluororesin in the fluororesin layer in the mold release film disclosed in Patent Document 1 or 2, or the fluororesin in the fluororesin film disclosed in Patent Document 5, contains, in many cases, fluorinated oligomers or other low molecular weight fluorinated compounds, derived from the fluororesin (hereinafter these will be referred to as oligomers, etc. derived from the fluororesin), and there is a risk that the oligomers, etc. derived from the fluororesin become contaminants to cause inconveniences.

That is, according to the study by the present inventors, it has been found that when the mold release film described in Patent Document 1 or 2 is used, in the encapsulating step, there is a problem that the resin-encapsulation portion is contaminated by oligomers, etc. derived from the fluorine resin in the release layer of the mold release film. Further, in Patent Documents 1 and 2, it is proposed to provide a release layer also on the mold side of the mold release film, but it has been found that in such a case, not only the resin-encapsulation portion but also the mold is likely to be contaminated by the oligomers, etc. derived from the fluororesin in the release layer.

According to the study by the present inventors, it has been further found that, in the case of using a fluororesin film as a mold release film, in the encapsulation step, there is a problem that oligomers, etc. derived from the fluororesin of the mold release film will adhere to the surface of the resin-encapsulation portion thereby to lower the adhesion between the resin-encapsulation portion and the ink layer.

It is an object of the present invention to provide a mold release film which is excellent in releasability and capable of suppressing contamination of a resin-encapsulation portion by the mold release film and which is capable of forming a resin-encapsulation portion excellent in adhesion to an ink layer, and a process for producing a semiconductor package using the mold release film.

Solution to Problem

The present invention provides a mold release film and a process for producing a semiconductor package, having the following constructions [1] to [14].

[1] A mold release film to be disposed on a cavity surface of a mold in a method for producing a semiconductor package wherein a semiconductor element is disposed in the mold and encapsulated with a curable resin to form a resin-encapsulation portion, characterized in that it has a first surface to be in contact with the curable resin at the time of forming the resin-encapsulation portion, and a second surface to be in contact with the cavity surface, at least the first surface is made of a fluororesin, and F/Al in the following test method A is from 0.2 to 4, or F/(C+F+O) in the following test method B is from 0.1 to 0.3:

<Test Method A>

A 1 mm thick cardboard, the mold release film, a 0.1 mm thick aluminum plate made of A1N30H-H18 material in accordance with JIS H4160 and a 1 mm thick cardboard are piled in this order so that the first surface and the aluminum plate are in contact with each other, and pressed for 5 minutes under conditions of 180° C. and 5 MPa, whereupon the mold release film is peeled off from the aluminum plate, and the surface of the aluminum plate which was in contact with the mold release film, is analyzed by an X-ray photoelectron spectroscopy to obtain the ratio (F/Al) of fluorine atoms to aluminum atoms, <Test Method B>

On a 3 mm thick first metal plate of a square shape with a size of 15 cm×15 cm, a 100 μm thick aluminum foil of a square shape with a size of 15 cm×15 cm is placed, on the aluminum foil, a 100 mm thick spacer of a square shape with a size of 15 cm×15 cm having a rectangular hole of 10 cm×8 cm opened at its center, is placed, in the vicinity of the center of the hole, 2 g of the following epoxy resin is placed, further thereon, the mold release film of a square shape with a size of 15 cm×15 cm is placed to let the first surface be on the spacer side, and thereon, a 3 mm thick second metal plate of a square shape with a size of 15 cm×15 cm is placed, to prepare a laminated sample; the laminated sample is pressed for 5 minutes under conditions of 180° C. and 10 MPa to cure the epoxy resin; after the pressing, the second metal plate, the mold release film and the spacer are removed, and the surface of the cured product of the epoxy resin that was in contact with the mold release film, is analyzed by an X-ray photoelectron spectroscopy to obtain the ratio (F/(C+F+O)) of fluorine atoms to the sum of carbon atoms, fluorine atoms and oxygen atoms:

Epoxy resin: epoxy granular resin for encapsulating semiconductors, trade name: SUMIKON EME G770H type F ver. GR, manufactured by Sumitomo Bakelite Co., Ltd.

[2] The mold release film according to [1], which has a thickness of from 16 to 200 μm.

[3] The mold release film according to [1] or [2], which is a film of a single-layer structure made of the fluororesin.

[4] The mold release film according to any one of [1] to [3], wherein the fluororesin is a fluoroolefin type polymer.

[5] The mold release film according to [4], wherein the fluoroolefin type polymer is an ethylene/tetrafluoroethylene copolymer.

[6] The mold release film according to [5], wherein the ethylene/tetrafluoroethylene copolymer comprises units based on tetrafluoroethylene, units based on ethylene and units based on a third monomer other than tetrafluoroethylene and ethylene, and the molar ratio (TFE/E) of the units based on tetrafluoroethylene to the units based on ethylene in the ethylene/tetrafluoroethylene copolymer, is from 80/20 to 40/60.

[7] The mold release film according to [5] or [6], wherein the ethylene/tetrafluoroethylene copolymer comprises units based on tetrafluoroethylene, units based on ethylene and units based on a third monomer other than tetrafluoroethylene and ethylene, and in all units in the ethylene/tetrafluoroethylene copolymer, the units based on tetrafluoroethylene are from 40 to 69.7 mol %, the units based on ethylene are from 30 to 59.7 mol %, and the units based on the third monomer are from 0.3 to 1.7 mol %.

[8] The mold release film according to [6] or [7], wherein the third monomer is hexafluoropropylene, perfluoro(propyl vinyl ether), (perfluoroethyl) ethylene or (perfluorobutyl) ethylene.

[9] The mold release film according to [6] or [7], wherein the third monomer is (perfluorobutyl) ethylene.

[10] The mold release film according to any one of [5] to [9], wherein the melt flow rate (MFR) of the ethylene/tetrafluoroethylene copolymer is from 2 to 40 g/10 min.

[11] The mold release film according to [4], wherein the fluoroolefin type polymer is a perfluoro(alkyl vinyl ether)/tetrafluoroethylene copolymer.

[12] The mold release film according to any one of [1] to [11], wherein the mold release film is made of a fluororesin film obtained by contacting a fluororesin film with a solvent to reduce components extractable by the solvent.

[13] A process for producing a semiconductor package formed of a semiconductor element and a curable resin and having a resin-encapsulation portion for encapsulating the semiconductor element, which comprises a step of disposing the mold release film as defined in any one of [1] to [12] on a cavity surface of a mold to be in contact with the curable resin, so that the first surface faces the space in the cavity, a step of disposing a substrate having a semiconductor element mounted thereon, in the cavity, encapsulating the semiconductor element with the curable resin, and curing the curable resin in such a state that it is in contact with the mold release film, to form a resin-encapsulation portion, thereby to obtain an encapsulated product comprising the substrate, the semiconductor element mounted on the substrate and the resin-encapsulation portion for encapsulating the semiconductor element, and a step of releasing the encapsulated product from the mold.

[14] A process for producing a semiconductor package formed of a semiconductor element and a curable resin and having a resin-encapsulation portion for encapsulating the semiconductor element, and an ink layer formed on the surface of the resin-encapsulation portion, which comprises a step of disposing the mold release film as defined in any one of [1] to [12] on a cavity surface of a mold to be in contact with the curable resin, so that the first surface faces the space in the cavity, a step of disposing a substrate having a semiconductor element mounted thereon, in the cavity, encapsulating the semiconductor element with the curable resin, and curing the curable resin in such a state that it is in contact with the mold release film, to form a resin-encapsulation portion, thereby to obtain an encapsulated product comprising the substrate, the semiconductor element mounted on the substrate and the resin-encapsulation portion for encapsulating the semiconductor element, a step of releasing the encapsulated product from the mold, and a step of forming an ink layer by using an ink, on the surface of the resin-encapsulation portion of the encapsulated product, which was in contact with the mold release film.

Advantageous Effects of Invention

According to the mold release film of the present invention, at the time of encapsulating a semiconductor element with a curable resin, it is excellent in releasability and can suppress contamination of the resin-encapsulation portion or the mold by the mold release film. Further, it is also possible to form a resin-encapsulation portion having excellent adhesion to an ink layer.

According to the process for producing a semiconductor package of the present invention, at the time of encapsulating a semiconductor element with a curable resin, it is excellent in releasability and can suppress contamination of the resin-encapsulation portion or the mold by the mold release film. Further, it is also possible to form an ink layer with good adhesion to the resin-encapsulation portion. Therefore, according to the process for producing a semiconductor package of the present invention, it is possible to produce a semiconductor package wherein an ink layer is less likely to be peeled off from the resin-encapsulation portion.

DESCRIPTION OF EMBODIMENTS

Figure 1:
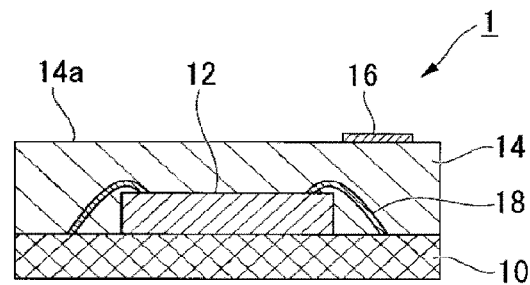
FIG. 1 is a schematic cross-sectional view showing an example of a semiconductor package to be produced by the process for producing a semiconductor package of the present invention.

In this specification, a "mold release film" is a mold release film to be disposed on a cavity surface of a mold in a method for producing a semiconductor package wherein a semiconductor element is disposed in the mold and encapsulated with a curable resin to form a resin-encapsulation portion. For example, at the time of forming a resin-encapsulation portion of a semiconductor package, it is a sheet to be disposed so as to cover a cavity surface of a mold that has the cavity of a shape corresponding to the shape of the resin-encapsulation portion, and as it is positioned between the formed resin-encapsulation portion and the cavity surface, it enhances the releasability of the obtained semiconductor package from the mold.

In a resin, "units" means structural units (monomer units) that constitute the resin.

A "fluororesin" means a resin containing fluorine atoms in its structure.

In this specification, an "arithmetic mean roughness (Ra)" is an arithmetic mean roughness to be measured in accordance with JIS B0601: 2013 (ISO4287: 1997, Amd. 1: 2009). In determining Ra, the standard length lr (cut-off value $\lambda$c) for roughness curve was set to be 0.8 mm, and the measurement speed was set to be 1.5 mm/sec.

In this specification, a "median diameter" is a value of the particle diameter where the cumulative distribution of particle diameters measured by a laser diffraction particle size distribution measuring apparatus in accordance with JIS Z8825: 2013 (ISO13320: 2009) becomes to be 50%.

The thickness of a mold release film is measured in accordance with ISO 4591: 1992 (JIS K7130: B1 method 1999, method for measuring thickness of sample taken from plastic film or sheet by mass method).

[Mold Release Film]

The mold release film of the present invention is a mold release film to be disposed on a cavity surface of a mold for forming a resin-encapsulation portion by encapsulating a semiconductor element with a curable resin, and it has a first surface to be in contact with the curable resin at the time of forming the resin-encapsulation portion, and a second surface to be in contact with the cavity surface.

That is, the mold release film of the present invention is disposed so that the first surface faces the space in the mold cavity and will be in contact with the curable resin at the time of forming the resin-encapsulation portion. Further, at that time, the second surface will be in close contact with the cavity surface of the mold. Therefore, by curing the curable resin in this state, the resin-encapsulation portion having a shape corresponding to the shape of the mold cavity will be formed.

From the viewpoint of releasability, at least the first surface of the mold release film of the present invention, is made of a fluororesin. It is thereby possible to smoothly peel, from the mold release film, the resin-encapsulation portion i.e. the curable resin cured in the state of being in contact with the mold release film.

The mold release film, of which the first surface is made of a fluororesin, may be one having a layer made of a fluororesin (hereinafter referred to as a fluororesin layer) at least as the outermost layer on the first surface side, and, for example, it may be a film made of a fluororesin, or a film with a multilayer structure comprising at least one layer made of a fluororesin and at least one layer made of a resin other than a fluororesin (hereinafter referred to also as another layer), wherein a fluororesin layer is disposed at least as the outermost layer on the first surface side.

An example of the film with a multilayer structure containing another layer may be one wherein, from the first surface side, a fluororesin layer and another layer are stacked in this order, or one wherein, from the first surface side, a fluororesin layer, another layer and a fluororesin layer are stacked in this order.

The fluororesin layer and another layer will be described in detail, respectively, hereinafter.

The mold release film of the present invention is preferably made of a fluororesin. When made of a fluororesin, the mold release film of the present invention is excellent in releasability and sufficiently has heat resistance capable of withstanding the temperature (typically from 150 to 180° C.) of the mold during molding, strength capable of withstanding the pressing force or flow of the curable resin, etc., and it is excellent also in elongation at a high temperature.

The mold release film made of a fluororesin may be a film of a single-layer structure comprising one layer of a fluororesin layer, or may be a film having a multilayer structure comprising a plurality of fluororesin layers.

If the mold release film has a multilayer structure, the physical properties such as followability, tensile strength, elongation, etc. tend to be low, and the suitability as a mold release film tends to be low as compared with the single layer structure. Further, its production is costly. Therefore, the mold release film of the present invention is particularly preferably a film of a single layer structure made of a fluororesin.

In the mold release film of the present invention, F/Al in the following test method A is from 0.2 to 4, or F/(C+F+O) in the following test method B is from 0.1 to 0.3.

<Test Method A>

A 1 mm thick cardboard, the mold release film, a 0.1 mm thick aluminum plate made of A1N30H-H18 material in accordance with JIS H4160 and a 1 mm thick cardboard are piled in this order so that the first surface and the aluminum plate are in contact with each other, and pressed for 5 minutes under conditions of 180° C. and 5 MPa, whereupon the mold release film is peeled off from the aluminum plate, and the surface of the aluminum plate which was in contact with the mold release film, is analyzed by an X-ray photoelectron spectroscopy to obtain the ratio (F/Al) of fluorine atoms to aluminum atoms.

F/Al is derived from a fluororesin of the mold release film and is an index representing the amount of oligomers, etc. (hereinafter referred to also as contaminant components) which cause contamination of the mold or the resin-encapsulation portion. When the pressing is conducted under the above conditions, contaminant components contained in the mold release film will migrate to the surface of the mold release film and will migrate from the surface to the aluminum plate. The smaller the F/Al, the smaller the amount of contaminant components to migrate to the aluminum plate surface from the mold release film during the pressing, and accordingly, the smaller the amount of contaminant components to migrate from the mold release film to the cavity surface of the mold or to the surface of the resin-encapsulation portion in a high temperature environment at the time of forming the resin-encapsulation portion by encapsulating a semiconductor element with a curable resin. When F/Al is at most 4, it is possible to sufficiently prevent the cavity surface of the mold and the surface of the resin-encapsulation portion from being contaminated by contaminant components derived from the mold release film.

As contaminant components, low molecular weight fluorinated com pounds such as oligomers derived from the fluororesin may be mentioned.

The upper limit value of F/Al is preferably 3.5, more preferably 3.3, particularly preferably 3, from the viewpoint of the effect to suppress contamination of the mold and the resin-encapsulation portion surface. When the lower limit value of F/Al is 0.2, contaminants components show the effect as a release layer from the mold.

F/Al as measured by the test method A is F/Al at the first surface.

In a case where the mold release film is a film of a single layer structure, it is preferred that F/Al at the first surface and F/Al at the second surface are the same. F/Al at the first surface and F/Al at the second surface may be different, but from the viewpoint of preventing the mold contamination by oligomers, etc. derived from the fluororesin, also F/Al at the second surface is preferably at most 4, more preferably at most 3.5, further preferably at most 3.3, particularly preferably at most 3. The lower limit value of the second surface may be zero, but is preferably 0.2.

In a case where the mold release film is a film having a multilayer structure, F/Al at the first surface and F/Al at the second surface may be the same or different. From the viewpoint of preventing the mold contamination by oligomers, etc. derived from the fluororesin, also F/Al at the second surface is preferably at most 4, more preferably at most 3.5, further preferably at most 3.3, particularly preferably at most 3. The lower limit value of the second surface may be zero, but is preferably 0.2.

<Test Method B>

On a 3 mm thick first metal plate of a square shape with a size of 15 cm×15 cm, a 100 μm thick aluminum foil of a square shape with a size of 15 cm×15 cm is placed, on the aluminum foil, a 100 mm thick spacer of a square shape with a size of 15 cm×15 cm having a rectangular hole of 10 cm×8 cm opened at its center, is placed, in the vicinity of the center of the hole, 2 g of the following epoxy resin is placed, further thereon, the mold release film of a square shape with a size of 15 cm×15 cm is placed to let the first surface be on the spacer side, and thereon, a 3 mm thick second metal plate of a square shape with a size of 15 cm×15 cm is placed, to prepare a laminated sample; the laminated sample is pressed for 5 minutes under conditions of 180° C. and 10 MPa to cure the epoxy resin; after the pressing, the second metal plate, the mold release film and the spacer are removed, and the surface of the cured product of the epoxy resin that was in contact with the mold release film, is analyzed by an X-ray photoelectron spectroscopy to obtain the ratio (F/(C+F+O)) of fluorine atoms to the sum of carbon atoms, fluorine atoms and oxygen atoms. Here, C, F and O are, respectively obtained from the speak areas of C1s, F1s and O1s.

Epoxy resin: epoxy granular resin for encapsulating semiconductors, trade name: SUMIKON EME G770H type F ver. GR, manufactured by Sumitomo Bakelite Co., Ltd.

F/(C+F+O) is derived from a fluororesin in the mold release film and is an index representing the amount of oligomers, etc. which cause contamination of the resin-encapsulation portion. When the pressing is conducted under the above conditions, the epoxy resin in the laminated sample is cured, whereby a cured product (a 0.1 mm thick epoxy resin plate with a size of 10 cm×8 cm) having a shape corresponding to the space surrounded by the aluminum foil, the spacer and the mold release film, will be formed. Further, at the same time, contaminant components contained in the mold release film will migrate to the surface of the mold release film, and then migrate from the surface to the surface of the formed cured product.

F/(C+F+O) is preferably from 0.15 to 0.28, particularly preferably from 0.18 to 0.25.

The smaller the F/(C+F+O), the smaller the amount of contaminant components which migrate to the surface of the cured product from the mold releasing film during pressing, and accordingly, the smaller the amount of contaminant components which migrate to the surface of the resin-encapsulation portion from the mold release film in a high temperature environment at the time of forming the resin-encapsulation portion by encapsulating a semiconductor element with a curable resin. When F/(C+F+O) is at most the upper limit value in the above range, it is possible to sufficiently prevent the surface of the resin-encapsulation portion from being contaminated by contaminant components derived from the mold release film.

On the other hand, the contaminant components may serve as a so-called WBL (Weak Boundary Layer) to improve the releasability between the mold release film and the epoxy resin. If F/(C+F+O) is extremely reduced, the releasability between the mold release film and the epoxy resin may become insufficient. Especially this is distinct in the case of an epoxy resin having a low glass transition point, which tends to readily adhere. When F/(C+F+O) is at least the lower limit value in the above range, the releasability between the mold release film and the epoxy resin will be excellent.

F/(C+F+O) measured by the test method B is F/(C+F+O) at the first surface.

In a case where the mold release film is a film of a single layer structure, it is preferred that F/(C+F+O) at the first surface and F/(C+F+O) at the second surface are the same. F/(C+F+O) at the first surface and F/(C+F+O) at the second surface may be different from each other, but from the viewpoint of preventing contamination of the cavity surface of the mold by oligomers, etc. derived from the fluororesin, F/(C+F+O) at the second surface is preferably at most 0.3, more preferably at most 0.28, particularly preferably at most 0.25. The lower limit value may be zero, but is preferably 0.1.

In a case where the mold release film is a film having a multilayer structure, F/(C+F+O) at the first surface and F/(C+F+O) at the second surface may be the same or different. From the viewpoint of preventing contamination of the cavity surface of the mold by oligomers, etc. derived from the fluororesin, F/(C+F+O) at the second surface is preferably at most 0.3, more preferably at most 0.28, particularly preferably at most 0.25. The lower limit value may be zero, but is preferably 0.1.

Here, the epoxy resin (trade name: SUMIKON EME G770H type F ver. GR, manufactured by Sumitomo Bakelite Co., Ltd.) to be used in the test method B, is one obtained by pulverizing, mixing and granulating the following raw materials for 5 minutes by a super mixer.

Phenylene skeleton-containing phenol aralkyl type epoxy resin (manufactured by Nippon Kayaku Co., Ltd., NC-3000, softening point: 58° C., epoxy equivalent: 277): 8 parts by mass Bisphenol A type epoxy resin (manufactured by Japan Epoxy Resins Co., Ltd., YL6810, melting point: 45° C., epoxy equivalent: 172): 2 parts by mass Phenylene skeleton-containing phenol aralkyl resin (manufactured by Mitsui Chemicals, Inc., XLC-4L, softening point: 65° C., hydroxy equivalent: 165): 2 parts by mass Phenol novolak resin (manufactured by Sumitomo Bakelite Co., Ltd., PR-HF-3, softening point: 80° C., hydroxy equivalent: 105): 2 parts by mass Curing accelerator (triphenylphosphine): 0.2 part by mass Inorganic filler (fused spherical silica with a median diameter of 16 µm): 84 parts by mass Carnauba wax: 0.1 part by mass Carbon black: 0.3 part by mass Coupling agent (3-glycidoxypropyltrimethoxysilane): 0.2 part by mass Here, the median diameter may be measured by the following method.

Into Labo-run Screw Tube 50 mL (trade name; mouth inside diameter: 20.3 mm, overall length: 35 mm) manufactured by AS ONE Corporation, 0.08 g of the fused spherical silica and 40 g of pure water are added and subjected to ultrasonic dispersion. For the ultrasonic dispersion, SONIFIER 250 (trade name) manufactured by BRANSON is used, and 3 cm from the tip of the tap type horn having a tip diameter of 12.5 mm and a full-length of 7 cm is immersed in the above measurement solution, followed by dispersion for 4 minutes at a frequency 20 kHz with an output power of 50 W. With respect to this dispersion, the particle size distribution is measured in a range of from 0.04 to 2,000 µm by polarization scattering intensity difference measurement by means of a laser diffraction scattering method particle size distribution measuring apparatus "Beckman Coulter LS230 (trade name)" manufactured by Beckman Coulter, Inc. The value where the cumulative distribution of measured particle diameters becomes 50% is taken as the median diameter.

The mold release film of the present invention is a mold release film which satisfies at least one of F/Al being from 0.2 to 4 by the test method A and F/(C+F+O) being from 0.1 to 0.3 by the test method B. The mold release film of the present invention may be one which satisfies both conditions. In many cases, if it satisfies one of the conditions, it also satisfies the other condition. In particular, in the case of most mold release films which satisfy the condition of F/(C+F+O) being from 0.1 to 0.3, F/Al is at most 4. On the other hand, in the case of mold release films which satisfy the condition of F/Al being from 0.2 to 4, sometimes F/(C+F+O) may not be from 0.1 to 0.3. As the mold release film of the present invention, a mold release film wherein F/(C+F+O) is from 0.1 to 0.3 is more preferred.

In a case where the encapsulation resin is a curable resin having a low glass transition point and being likely to easily adhere, such as an epoxy resin, and an ink layer is to be formed on the surface of a resin-encapsulated portion which was in contact with the mold release film, if contaminants which migrate to the surface of the resin-encapsulation portion from the mold release film, are reduced too much in an attempt to increase the adhesion of the ink layer, it is likely that the releasability tends to be inadequate as mentioned above. The test method B is a test to cure an epoxy resin on a mold release film and to measure the amount of fluorine atoms which have migrated to the cured epoxy resin surface, and therefore, in a case where a curable resin having a low glass transition point and being likely to easily adhere, is used as an encapsulation resin, and an ink layer is to be formed on the surface of the resin-encapsulation portion which was in contact with the mold release film, it is considered appropriate to evaluate the mold release film by using, as a parameter, $F/(C+F+O)$ by the test method B as a test method corresponding to such a case.

Therefore, in a case where it is necessary to take into consideration the balance of the adhesion of the ink layer and the releasability, it is preferred to use a mold release film in accordance with the results by the test of the test method B rather than the test by the test method A. Here, the releasability is evaluated by the after-described peeling force, and if the peeling force is too high, peeling between the mold release film and the cured encapsulation resin becomes difficult.

On the other hand, the test method A is a simple test method as compared with the test method B, and unless F/Al becomes too low, the releasability will be sufficient, and the adhesion of the ink layer to the resin-encapsulation portion will be also excellent.

(Surface Shape)

Each of the first and second surfaces may be smooth or may have irregularities formed. For example, both the first and second surfaces may be smooth, or both the first and second surfaces may have irregularities formed. Or, one of the first and second surfaces may be smooth and the other may have irregularities formed.

The arithmetic mean roughness (Ra) of the surface when it is smooth, is preferably from 0.01 to 0.2 µm, particularly preferably from 0.05 to 0.1 µm.

Ra of the surface when irregularities are formed thereon, is preferably from 1.5 to 2.1 µm, particularly preferably from 1.6 to 1.9 µm.

The surface shape in a case where irregularities are formed, may be a shape in which a plurality of convexes and/or concaves are randomly distributed, or may be a shape in which a plurality of convexes and/or concaves are regularly arranged. The shapes and sizes of the plurality of convexes and/or concaves may be the same or different.

The convexes may, for example, be elongated ridges extending on the surface of a mold release film, or protrusions scattered on the surface of a mold release film.

The concaves may, for example, be elongated grooves extending on the surface of a mold release film, or holes scattered on the surface of a mold release film.

The shapes of ridges or grooves may, for example, be linear, curved or bent shapes. On a release film surface, a plurality of ridges or grooves may be present in parallel to form stripes. The cross-sectional shapes of ridges or grooves, in a direction perpendicular to the longitudinal direction, may, for example, be polygonal such as triangular (V-shape), or semi-circular.

The shapes of protrusions or holes may, for example, be polygonal pyramid shaped such as triangular pyramid shaped, square pyramid shaped or hexagonal pyramid shaped, conical, hemispherical, polyhedral, or other various irregular shapes.

In a case where irregularities are formed on both the first and second surfaces, Ra and the surface shape of each surface may be the same or different.

(Thickness)

The thickness of the mold release film of the present invention is preferably from 16 to 200 µm, particularly preferably from 25 to 100 µm. When the thickness is at least the lower limit value in the above range, it is easy to handle the mold release film, and wrinkles are less likely to occur when the mold release film is placed to cover the mold cavity while pulling it. When the thickness is at most the upper limit value in the above range, the mold release film can be easily deformed, whereby followability to the shape of the mold cavity, will be improved, and accordingly the mold release film can be brought in close contact with the cavity surface, and it is possible to stably form a high quality resin-encapsulation portion.

The thickness of the mold release film of the present invention is preferably thinner within the above range, as the mold cavity becomes larger. Further, it is preferably thinner within the above range, as the mold becomes more complex with a larger number of cavities.

(Peel Force)

In the mold release film of the present invention, the maximum value of the peel force at the first surface side is preferably at most 0.8 N/25 mm, particularly preferably at most 0.5 N/25 mm. When the maximum value of the peel force is at most the upper limit value in the above range, during the production, peeling from a resin-encapsulation portion (a cured product of a curable resin) becomes easier. It will be less likely to happen that the apparatus has to be stopped as a mold release film and a resin-encapsulation portion are hardly peeled, and thus, continuous productivity will be excellent.

The "peel force" in the present invention represents a value measured by the following procedure of (a) to (f) in accordance with JIS K6854-2: 1999 (ISO 8510-2 1990).

(a) A suitable amount of an epoxy resin is disposed between a mold release film and an aluminum plate disposed on the first surface side of the mold release film.

(b) The mold release film and the aluminum plate sandwiching the epoxy resin are pressed at 180° C. under 10 MPa for 5 minutes, to cure the epoxy resin.

(c) A laminate of the mold release film, the cured epoxy resin and the aluminum plate is cut in a width of 25 mm to prepare five test pieces. Here, the thickness of the epoxy resin in the laminate is 100 µm.

(d) With respect to the test pieces, the 180° peel force at room temperature is measured at a rate of 100 mm/min by using a tensile tester.

(e) In the force (N)-grasp moving distance curve, an average value (unit: N/25 mm) of the peel force from a grasp moving distance of 25 mm to 125 mm, is obtained.

(f) An arithmetic mean of the average peel force values of the five test pieces, is obtained.

(Fluororesin Layer)

As the fluororesin constituting the fluororesin layer, a fluoroolefin type polymer may, for example, be mentioned, from the viewpoint of excellent releasability and heat resistance. One of fluororesins may be used alone, or two or more of them may be used in combination. In the fluororesin layer, inorganic additives, organic additives, etc. may be incorporated.

The fluoroolefin type polymer is a polymer having units based on a fluoroolefin. The fluoroolefin may, for example, be tetrafluoroethylene, vinyl fluoride, vinylidene fluoride, trifluoroethylene, hexafluoropropylene, or chlorotrifluoroethylene. One of fluoroolefins may be used alone, or two or more of them may be used in combination.

The fluoroolefin type polymer may, for example, be an ethylene/tetrafluoroethylene copolymer (hereinafter referred to also as ETFE), polytetrafluoroethylene, or a perfluoro (alkyl vinyl ether)/tetrafluoroethylene copolymer. Among them, ETFE is particularly preferred from such a viewpoint that the elongation at high temperatures is large. One type of ETFE may be used alone, or two or more types may be used in combination.

ETFE is a copolymer comprising units based on tetrafluoroethylene (hereinafter referred to also as TFE) and units based on ethylene (hereinafter referred to also as E).

As ETFE, preferred is one comprising units based on TFE, units based on E and units based on a third monomer other than TFE and E. By the type and content of units based on the third monomer, it is easy to adjust the crystallinity of the resin for the mold release film, i.e. the tensile modulus of the mold release film. Also, by having units based on a third monomer (especially a monomer having fluorine atoms), the tensile strength and elongation at a high temperature (especially at about 180° C.) will be improved.

As the third monomer, a monomer having fluorine atoms, or a monomer having no fluorine atom may be mentioned.

As examples of the monomer having fluorine atoms, the following monomers (a1) to (a5) may be mentioned.

Monomer (a1): a fluoroolefin having at most 3 carbon atoms.

Monomer (a2): a perfluoroalkyl ethylene represented by $X(CF_2)_nCY=CH_2$ (wherein, each of X and Y which are independent of each other, is a hydrogen atom or a fluorine atom, and n is an integer of from 2 to 8).

Monomer (a3): a fluorovinylether.

Monomer (a4): a functional group-containing fluorovinylether.

Monomer (a5): a fluorinated monomer having an aliphatic ring structure.

The monomer (a1) may, for example, be a fluoroethylene (such as trifluoroethylene, vinylidene fluoride, vinyl fluoride or chlorotrifluoroethylene), or a fluoropropylene (such as hexafluoropropylene (hereinafter referred to also as HFP), or 2-hydropentafluoropropylene).

The monomer (a2) is preferably a monomer wherein n is from 2 to 6, particularly preferably a monomer wherein n is from 2 to 4. Also, a monomer wherein X is a fluorine atom, and Y is a hydrogen atom, i.e. a (perfluoroalkyl) ethylene, is particularly preferred.

Specific examples of the monomer (a2) include the following compounds.

$CF_3CF_2CH=CH_2$ ((perfluoroethyl)ethylene), $CF_3CF_2CF_2CF_2CH=CH_2$ ((perfluorobutyl)ethylene; hereinafter referred to as PFBE), $CF_3CF_2CF_2CF_2CF=CH_2$, $CF_2HCF_2CF_2CF=CH_2$, $CF_2HCF_2CF_2CF_2CF=CH_2$, etc.

Specific examples of the monomer (a3) include the following compounds. Here, among the following, a monomer which is a diene, is a cyclo-polymerizable monomer.

$CF_2=CFOCF_3$, $CF_2=CFOCF_2CF_3$, $CF_2=CF(CF_2)_2CF_3$ (perfluoro(propyl vinyl ether); hereinafter referred to also as PPVE), $CF_2=CFOCF_2CF(CF_3)O(CF_2)_2CF_3$, $CF_2=CFO(CF_2)_3O(CF_2)_2CF_3$, $CF_2=CFO(CF_2CF(CF_3)O)_2(CF_2)_2CF_3$, $CF_2=CFOCF_2CF(CF_3)O(CF_2)_2CF_3$, $CF_2=CFOCF_2CF=CF_2$, $CF_2=CFO(CF_2)_2CF=CF_2$, etc.

Specific examples of the monomer (a4) include the following compounds.

$CF_2=CFO(CF_2)_3CO_2CH_3$, $CF_2=CFOCF_2CF(CF_3)O(CF_2)_3CO_2CH_3$, $CF_2=CFOCF_2CF(CF_3)O(CF_2)_2SO_2F$, etc.

Specific examples of the monomer (a5) include perfluoro (2,2-dimethyl-1,3-dioxole), 2,2,4-trifluoro-5-trifluoromethoxy-1,3-dioxole, perfluoro(2-methylene-4-methyl-1,3-dioxolane), etc.

As examples of the monomer having no fluorine atom, the following monomers (b1) to (b4) may be mentioned.

Monomer (b1): an olefin.

Monomer (b2): a vinyl ester.

Monomer (b3): a vinyl ether.

Monomer (b4): an unsaturated acid anhydride.

Specific examples of the monomer (b1) include propylene, isobutene, etc.

Specific examples of the monomer (b2) include vinyl acetate, etc.

Specific examples of the monomer (b3) include ethyl vinyl ether, butyl vinyl ether, cyclohexyl vinyl ether, hydroxybutyl vinyl ether, etc.

Specific examples of the monomer (b4) include maleic anhydride, itaconic anhydride, citraconic anhydride, himic anhydride (5-norbornene-2,3-dicarboxylic acid anhydride), etc.

One of the third monomers may be used alone, or two or more of them may be used in combination.

The third monomer is preferably the monomer (a2), HFP, PPVE or vinyl acetate, more preferably HFP, PPVE, (perfluoroethyl)ethylene or PFBE, particularly preferably PFBE, in that adjustment of the crystallinity, i.e. the tensile modulus, will be thereby easy, and by having units based on a third monomer (especially a monomer having fluorine atoms), the tensile strength and elongation at a high temperature (particularly at about 180° C.) will be excellent.

That is, as ETFE, particularly preferred is a copolymer having units based on TFE, units based on E and units based on PFBE.

The proportion of units based on TFE in ETFE is preferably from 40 to 70 mol %, more preferably from 45 to 65 mol %, particularly preferably from 50 to 60 mol %, in all units. When the proportion of units based on TFE is at least the lower limit value in the above range, the releasability will be excellent. When the proportion of units based on TFE is at most the upper limit value in the above range, the followability will be excellent.

The proportion of units based on E in ETFE is preferably from 30 to 60 mol %, more preferably from 35 to 55 mol %, particularly preferably from 40 to 50 mol %. When the proportion of units based on E is at least the lower limit value in the above range, the mechanical properties will be excellent. When the proportion of units based on E is at most the upper limit value in the above range, the releasability will be excellent.

In ETFE, the molar ratio (TFE/E) of units based on TFE to units based on E is preferably from 80/20 to 40/60, more preferably from 70/30 to 45/55, particularly preferably from 65/35 to 50/50. When TFE/E is within the above range, the heat resistance and mechanical properties of ETFE will be excellent.

The proportion of units based on the third monomer in ETFE is preferably from 0.3 to 1.7 mol %, more preferably from 0.5 to 1.5 mol %, particularly preferably from 0.7 to 1.2 mol %. When the proportion of units based on the third monomer is at least the lower limit value in the above range, the mechanical strength at a high temperature will be excellent. When the proportion of units based on the third monomer is at most the upper limit value in the above range, F/Al in the mold releasing film tends to be from 0.2 to 4, and F/(C+F+O) also tends to be from 0.1 to 0.3.

From the foregoing, ETFE is preferably one comprising from 40 to 69.7 mol % of units based on TFE, from 30 to 59.7 mol % of units based on E and from 0.3 to 1.7 mol % of units based on the third monomer, more preferably one comprising from 45 to 64.5 mol % of units based on TFE, from 35 to 54.5 mol % of units based on E and from 0.5 to 1.5 mol % of units based on the third monomer, particularly preferably one comprising from 50 to 59.3 mol % of units based on TFE, from 40 to 49.3 mol % of units based on E and from 0.7 to 1.2 mol % of units based on the third monomer.

The melt flow rate (MFR) of ETFE is preferably from 2 to 40 g/10 min, more preferably from 5 to 30 g/10 min, particularly preferably from 10 to 20 g/10 min. When MFR of ETFE is within the above range, the moldability of ETFE will be improved, and the mechanical properties of the mold release film will be excellent.

MFR of ETFE is a value measured under a load of 49 N at 297° C. in accordance with ASTM D3159.

The melting point of the fluororesin is preferably from 200 to 350° C., particularly preferably from 220 to 310° C. When the melting point of the fluororesin is within the above range, the heat resistance will be excellent, and molding will be easy.

The glass transition temperature of the fluororesin is preferably from 60 to 110° C., particularly preferably from 70 to 100° C. When the glass transition temperature of the fluororesin is within the above range, handling efficiency in roll-to-roll will be excellent, and followability to the mold will be excellent.

The glass transition temperature of the fluororesin is a temperature at the time when tan δ (E"/E') being the ratio of the loss modulus E" to the storage modulus E' to be measured in accordance with ISO6721-4: 1994 (JIS K7244-4: 1999) takes the maximum value.

As the fluoroolefin type polymer, also preferred is a perfluoro(alkyl vinyl ether)/tetrafluoroethylene copolymer. As the perfluoro(alkyl vinyl ether), among the specific examples mentioned as the monomer (a3), compounds having one polymerizable double bond, excluding the diene, may be mentioned. Among them, PPVE is particularly preferred.

The proportion of perfluoro(alkyl vinyl ether) units in the perfluoro(alkyl vinyl ether)/tetrafluoroethylene copolymer is preferably from 0.5 to 5 mol %, more preferably from 1.0 to 3 mol %, particularly preferably from 1.2 to 2.0 mol %, in all units. When the proportion of units based on the perfluoro (alkyl vinyl ether) is at least the lower limit value in the above range, the mechanical strength at a high temperature will be excellent. When the proportion of units based on the third monomer is at most the upper limit value in the above range, F/Al in the mold release film tends to be from 0.2 to 4, and F/(C+F+O) also tends to be from 0.1 to 0.3.

The melt flow rate (MFR) of the perfluoro(alkyl vinyl ether)/tetrafluoroethylene copolymer is preferably from 2 to 40 g/10 min, more preferably from 5 to 30 g/10 min, particularly preferably from 10 to 20 g/10 min. When MFR is within the above range, the moldability will be improved, and the mechanical properties of the mold release film will be excellent.

MFR of the perfluoro(alkyl vinyl ether)/tetrafluoroethylene copolymer is a value measured under a load of 49 N at 372° C. in accordance with ASTM D3307.

(Other Layers)

The mold release film is required to have releasability, heat resistance to withstand the temperature of the mold during molding (typically from 150 to 180° C.) and strength to withstand the pressing pressure and flow of the curable resin.

In a case where the mold release film of the present invention is a film having a multilayer structure comprising a fluororesin layer and another layer, preferred as another layer is a layer made of at least one resin selected from the group consisting of a polyolefin, a polyester, a polyamide, a polystyrene and an ethylene/vinyl alcohol copolymer from the viewpoint of releasability, heat resistance, strength and elongation at a high temperature. In another layer, an inorganic additive, an organic additive, etc. may be incorporated.

The polyolefin is preferably polymethylpentene from the viewpoint of excellent releasability and mold followability. One of polyolefins may be used alone, or two or more of them may be used in combination.

The polyester is preferably polyethylene terephthalate, polybutylene terephthalate, or polynaphthalene terephthalate from the viewpoint of strength. One of polyesters may be used alone, or two or more of them may be used in combination.

The polyamide is preferably nylon 6 or nylon MXD6 from the viewpoint of heat resistance, strength and the gas barrier property. The polyamide may be one that is stretched or not stretched. One of polyamides may be used alone, or two or more of them may be used in combination.

The polystyrene is preferably syndiotactic polystyrene from the viewpoint of heat resistance and strength. One of polystyrenes may be used alone, or two or more of them may be used in combination.

As another layer, a gas barrier layer may be contained. The gas barrier layer may, for example, be a metal vapor deposition layer, a metal oxide vapor deposition layer, a polyvinylidene chloride layer, a polyvinyl alcohol-type resin layer, or a meta-xylene diamine-type epoxy resin layer.

(Method for Producing Mold Release Film)

As a method for producing the mold release film of the present invention, for example, the following methods (I) to (VI) may be mentioned. Two or more of methods (I) to (VI) may be used in combination.

In these methods, by using a raw material containing a less amount of contaminant components (oligomers, etc. in the fluororesin), by suppressing an increase of the contaminant components at the time of molding, or by conducting treatment to remove the contaminant components, a fluororesin film satisfying the desired F/Al or the desired F/(C+ F+O) (both may be satisfied simultaneously) is obtained.

However, the method for producing the mold release film of the present invention is not limited to them. It is also possible to use a plurality of these methods in combination.

(I) A method of molding, as a fluororesin, ETFE wherein the proportion of units based on a third monomer is from 0.3 to 1.7 mol %, to obtain a fluororesin film (a mold release film) wherein F/Al is from 0.2 to 4 or F/(C+F+O) is from 0.1 to 0.3.

(II) A method of contacting a fluorine resin film with a solvent to reduce components (contaminant components) to be extracted by a solvent. That is, a method of extracting contaminant components with a solvent for a proper time from a fluororesin film wherein F/Al exceeds 4 or F/(C+F+O) exceeds 0.3, to obtain a fluororesin film (a mold release film) wherein F/Al is from 0.2 to 4 or F/(C+F+O) is from 0.1 to 0.3.

(III) A method of molding a fluororesin under a reduced pressure to obtain a fluororesin film (a mold release film) wherein F/Al is from 0.2 to 4 or F/(C+F+O) is from 0.1 to 0.3.

(IV) A method of letting a fluororesin immediately after being extruded from a T-die, pass between a cooling roll with a metallic mirror surface heated so that the surface temperature is at least the glass transition temperature and at most the melting point, and a rubber pressing roll likewise heated so that the surface temperature is at least the glass transition temperature and at most the melting point, to transfer contaminants to the cooling roll with a metallic mirror surface, thereby to obtain a fluororesin film (a mold release film) wherein F/Al is from 0.2 to 4 or F/(C+F+O) is from 0.1 to 0.3.

(V) A method of letting a fluororesin film pass between a cooling roll with a metallic mirror surface heated so that the surface temperature is at least the glass transition temperature and at most the melting point, and a rubber pressing roll likewise heated so that the surface temperature is at least the glass transition temperature and at most the melting point, to transfer contaminant components to the cooling roll with a metallic mirror surface, thereby to obtain a fluororesin film (a mold release film) wherein F/Al is from 0.2 to 4 or F/(C+F+O) is from 0.1 to 0.3.

(VI) A method wherein, during extrusion of a fluororesin film, the groove depth of screw metering zone of the extruder, is made deeper to reduce the shear rate exerted on the molten resin thereby to reduce heat generation of the resin and to prevent decomposition, thereby to obtain a fluororesin film (a mold release film) wherein F/Al is from 0.2 to 4 or F/(C+F+O) is from 0.1 to 0.3.

Method (I):

When the proportion of units based on the third monomer in ETFE, is from 0.3 to 1.7 mol %, in the resulting fluororesin film, the content of contaminant components will be small, and F/Al tends to be from 0.2 to 4 and at the same time, F/(C+F+O) also tends to be from 0.1 to 0.3.

The method for producing a fluororesin film is not particularly limited, and it is possible to utilize a known production method.

The method for producing a mold release film being smooth on both sides may, for example, be a method of melt molding by means of an extruder equipped with a T die having a predetermined lip width.

The method for producing a mold release film having irregularities formed on one side or both sides may, for example, be a method of transferring irregularities of the base die to the surface of the fluororesin film by thermal processing, and from the viewpoint of productivity, the following methods (i), (ii), etc. are preferred.

(i) A method of passing a resin film between a cooling roll as the base die and a pressing roll, to continuously transfer the irregularities formed on the surface of the base die roll to the surface of the resin film.

(ii) A method of passing a resin extruded from a die of an extruder between a cooling roll as the base die and a pressing roll, to form the resin into a film and, at the same time, to continuously transfer the irregularities formed on the surface of the base die roll to the surface of the film-form resin.

In the methods (i) and (ii), by using a roll-form base die, continuous processing becomes possible, and the productivity of the mold release film having irregularities formed is markedly improved. At the same time, a wound-up mold release film is obtainable, and therefore, in the production of a semiconductor package, it is possible to use a commonly employed compression molding apparatus or transfer molding apparatus having a feeding mechanism and a winding mechanism of the mold release film.

Further, in the methods (i) and (ii), when as the roll pressing mold, one having irregularities on its surface is used, it is possible to obtain a mold release film having irregularities formed on both sides.

Method (II):

As the solvent, one presenting a high swelling ratio to the resin, without changing the thickness of the fluororesin film before and after the solvent extraction treatment, and capable of dissolving the contaminant components, is used. When the fluororesin film is immersed in such a solvent, contaminant components in the fluororesin film will be dissolved in the solvent and removed from the fluororesin film, whereby F/Al decreases and at the same time, F/(C+F+O) also decreases.

As the fluororesin film to be subjected to the solvent extraction treatment, a commercially available one may be used, or one produced by a known production method as mentioned above may be used.

Specific examples of the solvent may, for example, be fluorinated solvents, such as ASAHIKLIN AK225 (manufactured by Asahi Glass Company, Limited, dichloropentafluoropropane), ASAHIKLIN AE-3000 (manufactured by Asahi Glass Company, Limited, $CF_3CH_2OCF_2CF_2H$), etc., chlorinated solvents such as chloroform, methylene chloride, etc., hydrocarbon ether, ester or ketone solvents, such as tetrahydrofuran, acetone, ethyl acetate, etc.

The treating temperature (immersion temperature) is preferably from 23 to 50° C.

The treating time (immersion time) varies depending on the treating temperature, but is preferably from 1 to 240 hours.

Method (III):

When the molding of the fluororesin is carried out under reduced pressure, contaminant components in the fluororesin are volatilized, whereby F/Al of the obtainable fluororesin film becomes small, and at the same time, F/(C+F+O) also becomes small.

Film molding of the fluorine resin is usually carried out by an extruder, and a method of sucking volatile gases by providing a vacuum vent line at the compression region where the shearing heat is most applied, is preferred.

The air pressure in the vent line is preferably from 1 to 1,000 Pa, particularly preferably from 100 to 1,000 Pa. When the air pressure is at least the lower limit value in the above range, it is possible to prevent a so-called vent-up i.e. rising of the melted fluororesin in the vacuum vent. When the air pressure is at most the upper limit value in the above range, contaminant components tend to readily volatilize.

The temperature during molding of the fluororesin is preferably from 280 to 330° C., particularly preferably from 300 to 320° C. from the viewpoint that the fluororesin is thereby excellent in flowability and hardly decomposable. When it is at least the lower limit value in the above range, the fluororesin is excellent in moldability. When it is at most the upper limit value in the above range, decomposition of the fluororesin is little.

Method (IV):

By pressing the fluororesin immediately after the melt extrusion, to the cooling roll with the metallic mirror surface heated to at least the glass transition temperature and at most the melting point of the resin, contaminant components will migrate to the roll surface, and F/Al of the obtainable fluororesin film becomes small and at the same time, F/(C+F+O) also becomes small.

As to the material of a roll, the cooling roll is preferably a mirror-surfaced roll made of metal, and the pressing roll is preferably a rubber roll. The temperature of the metallic mirror surfaced cooling roll and the rubber pressing roll, is preferably from the glass transition temperature +30° C. to the melting point −40° C., more preferably from the glass transition temperature +50° C. to the melting point −60° C. When it is at least the glass transition temperature +30° C., contaminant components tend to be readily exuded from the fluororesin film, and tend to be readily transferred to the roll. When it is at most the melting point −40° C., no change is likely to be observed in the thickness of the fluororesin film even after passing the pressing roll.

The arithmetic mean roughness Ra of the metallic mirror roll is preferably from 0.01 to 0.1. When it is within the above range, the fluororesin film and the roll will be properly closely in contact with each other so that the exuded contaminant components tend to be readily transferred.

As the rubber hardness of the pressing roll, the hardness (hereinafter referred to also as Shore D hardness) measured by a type D durometer in accordance with ISO7169-1, is preferably from D60 to 80, and the linear pressure of the pressing rolls is preferably from 49 to 490 N/cm. When the Shore D hardness and the linear pressure are within the above ranges, a proper pressure will be exerted on the fluororesin film, and contaminant components oozing out from the fluororesin film will be readily transferred to the cooling roll with the metal mirror surface, and the thickness of the film will be less likely to change.

Method (V):

After melt-extruding the fluororesin and forming the fluororesin film, the obtained film is continuously pressed to a metallic mirror roll heated to at least the glass transition temperature and at most the melting point, whereby contaminant components will migrate to the roll surface, and F/Al of the obtainable fluororesin film becomes small and at the same time, F/(C+F+O) also becomes small.

As to the material of the rolls, the base die roll is preferably a mirror-surfaced roll made of metal, and the pressing roll is preferably a rubber roll.

The temperature of the metallic mirror roll and the rubber pressing roll, is preferably from the glass transition temperature +60° C. to the melting point −40° C., more preferably from the glass transition temperature +70° C. to the melting point −60° C. When it is at least the glass transition temperature of +60° C., the fluororesin film is well preheated, and contaminant components will be readily exuded and will be readily transferred to the roll. When it is at most the melting point −40° C., the thickness of the fluororesin film is less likely to change even after passing the pressing roll.

The arithmetic mean roughness Ra of the metallic mirror roll is preferably from 0.01 to 0.1. When it is within the above range, the fluororesin film and the roll will be properly closely in contact with each other so that exuded contaminant components will be readily transferred.

The Shore D hardness of the pressing roll is preferably from D60 to 80, and the linear pressure of the pressing roll is preferably from 49 to 490 N/cm. When the Shore D hardness and the linear pressure are within the above ranges, a proper pressure will be exerted on the fluororesin film, and contaminant components oozing out from the fluororesin film will be readily transferred to the metallic mirror roll, and the thickness of the film is less likely to change.

The process of passing between the metallic mirror roll and the pressing roll may be repeated twice or more times.

Before passing between the metallic mirror roll and the pressing roll, the fluororesin film may be preheated. As a method for preheating, heating by an infrared heater, or heating along a heating roll, may be mentioned. Preheating is preferably conducted until the surface temperature of the film becomes to be at most the glass transition temperature. If the surface temperature is at most the glass transition temperature, wrinkles are less likely to occur during transportation.

Method (VI):

By lowering the shear rate exerted to the fluororesin melted in an extruder during extrusion of the fluororesin film, to prevent overheating of the molten resin, thereby to suppress generation of contaminant components, F/Al of the obtainable fluororesin film becomes small, and at the same time, F/(C+F+O) also becomes small.

Usually, the shear rate exerted to the molten resin at the metering zone in the extruder is expressed by the following equation. In the following, $s^{-1}$ represents 1/sec, and rpm represents revolutions per minute.

$$\gamma = \pi \cdot D \times N / (60 \cdot h)$$

γ: shear rate ($s^{-1}$)
D: cylinder diameter (cm)
N: screw rotation speed (rpm)
h: groove depth of the screw metering section (cm)

Preferably the shear rate is from 5 to 50 $s^{-1}$. When the shear rate is at least the lower limit value in the above range, sufficient shear heat is given to the fluororesin, and the fluororesin is sufficiently melted. When the shear rate is at most the upper limit value in the above range, decomposition of the fluororesin by overheating will be little, and, generation of contaminants will be little.

Further, the screw is divided into three main sections, i.e. introduction section, compression section and metering section, and one on which the shear is exerted, is mainly the metering section. The length of the screw is usually represented by the effective length L (screw length)/D (extruder diameter), and L/D is preferably from 20 to 30. Further, the length of the metering section alone, i.e. L (metering section)/D is preferably from 6 to 8. Within such ranges, the fluctuation in the discharge amount of the molten resin is little, and it is possible to reduce shear heat exerted to the molten resin.

[Semiconductor Package]

The semiconductor package to be produced by the process for producing a semiconductor package of the present invention as described below, by using the mold release film of the present invention, may, for example, be an integrated circuit having integrated a semiconductor device such as a transistor or a diode.

The package shape of the integrated circuit may, for example, be BGA (Ball Grid Array), QFN (Quad Flat Non-leaded package), SON (Small Outline Non-leaded package), or the like.

As one process for producing a semiconductor package, there is a process which comprises a step (collective encapsulation step) of mounting a plurality of semiconductor elements on a substrate, and collectively encapsulating such semiconductor elements with a curable resin, to obtain a collectively encapsulated product comprising the substrate, the plurality of semiconductor elements and the resin-encapsulation portion, and a step (a singulation step) of cutting and singulating the substrate and the resin-encapsulation portion in the collectively encapsulated product so as to separate the plurality of semiconductor elements, thereby to obtain a plurality of semiconductor packages. As the semiconductor package, from the viewpoint of productivity, preferred is one that is produced via the collective encapsulation step and the singulation step, and, for example, an integrated circuit or the like, may be mentioned wherein the encapsulation system is a MAP (Moldied Array Packaging) system or a WL (Wafer Lebel packaging) system.

FIG. 1 is a schematic cross-sectional view showing an example of a semiconductor package. The semiconductor package 1 of this example is an integrated circuit of a so-called MAP-BGA shape.

The semiconductor package 1 comprises a substrate 10, a semiconductor chip (semiconductor element) 12 mounted on the substrate 10, a resin-encapsulation portion 14 for encapsulating the semiconductor chip 12 and an ink layer 16 which is formed on the upper surface 14a of the resin-encapsulation portion 14.

The semiconductor chip 12 has a surface electrode (not shown), the substrate 10 has a substrate electrode (not shown) corresponding to the surface electrode of the semiconductor chip 12, and the surface electrode and the substrate electrode are electrically connected by a bonding wire 18.

The thickness of the resin-encapsulation portion 14 (the shortest distance from the semiconductor chip 12-mounted surface of the substrate 10 to the upper surface 14a of the resin-encapsulation portion 14) is not particularly limited, but is preferably at least "the thickness of the semiconductor chip 12" and at most "the thickness of the semiconductor chip 12+1 mm", particularly preferably at least "the thickness of the semiconductor chip 12" and at most "the thickness of the semiconductor chip 12+0.5 mm".

[Process for Producing Semiconductor Package]

The process for producing a semiconductor package of the present invention is a process for producing a semiconductor package formed of a semiconductor element and a curable resin and having a resin-encapsulation portion for encapsulating the semiconductor element, which comprises a step of disposing the above-described mold release film of the present invention on a cavity surface of a mold to be in contact with the curable resin, so that the first surface faces the space in the cavity, a step of disposing a substrate having a semiconductor element mounted thereon, in the cavity, encapsulating the semiconductor element with the curable resin, and curing the curable resin in such a state that it is in contact with the mold release film, to form a resin-encapsulation portion, thereby to obtain an encapsulated product comprising the substrate, the semiconductor element mounted on the substrate and the resin-encapsulation portion for encapsulating the semiconductor element, and a step of releasing the encapsulated product from the mold.

Further, in the process for producing a semiconductor package of the present invention for forming an ink layer by printing with an ink, the process has, as a step after the above releasing step, a step of forming an ink layer by using an ink, on the surface of the resin-encapsulation portion of the encapsulated product, which was in contact with the mold release film.

For the process for producing a semiconductor package of the present invention, a known production process may be employed except for the use of the mold release film of the present invention.

For example, as a method of forming the resin-encapsulation portion, the compression molding method or transfer molding method may be mentioned, and as an apparatus to be used in such a case, it is possible to use a known compression-molding apparatus or transfer molding apparatus. The production conditions may also be the same as the conditions in a conventional method of producing a semiconductor package.

First Embodiment

As one embodiment of the process for producing a semiconductor package, a case of producing a semiconductor package 1 as shown in FIG. 1 by a compression molding method, will be described in detail.

The process for producing a semiconductor package by this embodiment has the following steps ($\alpha$1) to ($\alpha$6) or steps ($\alpha$1) to ($\alpha$7).

($\alpha$1) A step of disposing the mold release film of the present invention, so that the mold release film covers the cavity of the mold, and the first surface of the mold release film faces the space in the cavity (so that the second surface faces the cavity surface).

($\alpha$2) A step of vacuum sucking the mold release film to the side of the cavity surface of the mold.

($\alpha$3) A step of filling a curable resin into the cavity.

($\alpha$4) A step of disposing a substrate having a plurality of semiconductor elements mounted thereon at a predetermined position in the cavity, and collectively encapsulating the plurality of semiconductor elements by the curable resin to form a resin-encapsulation portion, thereby to obtain a collectively encapsulated product comprising the substrate, the plurality of semiconductor elements mounted on said substrate and the resin-encapsulation portion collectively encapsulating said plurality of semiconductor elements.

($\alpha$5) A step of taking out the collectively encapsulated product from the mold.

($\alpha$6) A step of cutting the substrate and the resin-encapsulation portion of the collectively encapsulated product, so that the plurality of semiconductor elements are separated, to obtain singulated encapsulated products, each comprising a substrate, at least one semiconductor element mounted on the substrate, and a resin-encapsulation portion encapsulating the semiconductor element.

($\alpha$7) A step of forming an ink layer by using an ink on the surface of the resin-encapsulated portion of each singulated encapsulated product, to obtain a semiconductor package.

Figure 2:
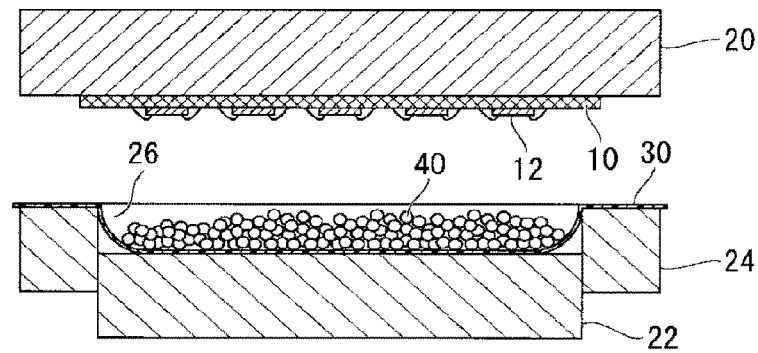
FIG. 2 is a cross-sectional view illustrating schematically the step ($\alpha$3) in the first embodiment of the process for producing a semiconductor package of the present invention.

Mold:

As the mold in the first embodiment, it is possible to use one known as a mold to be used for compression molding, and for example, as shown in FIG. 2, a mold comprising a stationary upper mold 20, a cavity bottom member 22, and a frame-shaped movable lower mold 24 disposed at the periphery of the cavity bottom member 22, may be mentioned.

In the stationary upper mold 20, a vacuum vent (not shown) for adsorbing a substrate 10 to the stationary upper mold 20 by sucking air between the substrate 10 and the stationary upper mold 20, is formed. Further, in the cavity bottom member 22, a vacuum vent (not shown) for adsorbing a mold release film 30 to the cavity bottom member 22 by sucking air between the mold release film 30 and the cavity bottom member 22, is formed.

In this mold, a cavity 26 having a shape corresponding to the shape of a resin-encapsulation portion 14 to be formed in the step (α4) is formed by the upper surface of the cavity bottom member 22 and the inner side surfaces of the movable lower mold 24.

Hereinafter, the top surface of the cavity bottom member 22 and the inner side surfaces of the movable lower mold 24 may be collectively referred to also as the cavity surface.

Step (α1):

On the movable lower mold 24, the mold release film 30 is disposed so as to cover the upper surface of the cavity bottom member 22. At that time, the mold release film 30 is disposed so that the second surface is directed to the lower side (the cavity bottom member 22 direction).

The mold release film 30 is fed from an unwinding roll (not shown) and is wound up on a winding roll (not shown). The mold release film 30 is pulled by the unwinding roll and the winding roll, and therefore will be disposed, in a stretched state, on the movable lower mold 24.

Step (α2):

Separately, by vacuum suction through the vacuum vent (not shown) of the cavity bottom member 22, the space between the upper surface of the cavity bottom member 22 and the mold release film 30 is evacuated, so that the mold release film 30 is stretched, deformed and vacuum-adsorbed on the upper surface of the cavity bottom member 22. Further, by tightening the frame-shaped movable lower mold 24 disposed at the periphery of the cavity bottom member 22, the mold release film 30 is pulled from all directions to be in tension.

Here, the mold release film 30 may not necessarily be in close contact with the cavity surface, depending upon the strength and thickness of the mold release film 30 in a high temperature environment, and the shape of the concave formed by the upper surface of the cavity bottom member 22 and the inner side surfaces of the movable lower mold 24. In the stage of vacuum suction in the step (α2), as shown in FIG. 2, an air gap may be slightly left between the mold release film 30 and the cavity surface.

Step (α3):

As shown in FIG. 2, a curable resin 40 is loaded in a suitable amount onto the mold release film 30 in the cavity 26 by an applicator (not shown).

Further, separately, by vacuum suction through a vacuum vent (not shown) of the stationary upper mold 20, a substrate 10 having a plurality of semiconductor chips 12 mounted thereon, is vacuum adsorbed on the lower surface of the stationary upper mold 20.

As the curable resin 40, various curable resins used in the production of semiconductor packages may be used. A thermosetting resin such as an epoxy resin or a silicone resin is preferred, and an epoxy resin is particularly preferred.

The epoxy resin may be a monomer, an oligomer or a polymer, having at least two epoxy groups in its molecule, and its molecular weight or molecular structure is not particularly limited For example, crystalline epoxy resins such as biphenyl type epoxy resins, bisphenol A type epoxy resins, bisphenol F type epoxy resins, stilbene type epoxy resins, or hydroquinone type epoxy resins; novolak type epoxy resins such as cresol novolac type epoxy resins, phenol novolak type epoxy resins, or naphthol novolac epoxy resin; phenol aralkyl type epoxy resins such as phenylene skeleton-containing phenol aralkyl type epoxy resins, biphenylene skeleton-containing phenol aralkyl type epoxy resins, or phenylene skeleton-containing naphthol aralkyl type epoxy resins; trifunctional epoxy resins such as triphenolmethane type epoxy resins, or alkyl-modified triphenolmethane type epoxy resins; modified phenol type epoxy resins such as dicyclopentadiene-modified phenol type epoxy resins, or terpene-modified phenol type epoxy resins; heterocycle-containing epoxy resins such as triazine nucleus-containing epoxy resins, etc. may be mentioned. One of them may be used alone, or two or more of them may be used in combination.

A curing agent to be used, is not particularly limited as long as it can be reacted to cure the epoxy resin. For example, the following curing agents may be mentioned. These may be used alone, or in combination of two or more.

Aliphatic amine-type curing agents: linear aliphatic diamines having from 2 to 20 carbon atoms, such as ethylenediamine, trimethylene diamine, tetramethylene diamine, hexamethylenediamine, etc.

Aromatic amine-type curing agents: meta-phenylenediamine, para-phenylenediamine, para-xylene diamine, 4,4'-diaminodiphenylmethane, 4,4'-diaminodiphenyl propane, 4,4'-diaminodiphenyl ether, 4,4'-diaminodiphenyl sulfone, 4,4'-diaminodicyclohexane, bis (4-aminophenyl)phenyl methane, 1,5-diaminonaphthalene, m-xylene diamine, para-xylylenediamine, 1,1-bis (4-aminophenyl) cyclohexane, etc.

Phenol resin-type curing agents: resol type phenol resins such as an aniline-modified resol resin, a dimethyl ether resol resin, etc.; novolak type phenolic resins such as a phenol novolak resin, a cresol novolak resin, a tert-butylphenol novolak resin, a nonylphenol novolak resin, etc.; phenol aralkyl resins such as a phenylene skeleton-containing phenol aralkyl resin, a biphenylene skeleton-containing phenol aralkyl resin, etc.; phenol resins having a condensed polycyclic structure such as a naphthalene skeleton and an anthracene skeleton; polyoxystyrene resins such as a poly-p-oxy-styrene, etc.

Polycarboxylic acid anhydride curing agents: alicyclic acid anhydrides such as hexahydrophthalic anhydride (HHPA), methyl tetrahydrophthalic anhydride (MTHPA), etc.; aromatic acid anhydrides such as trimellitic anhydride (TMA), pyromellitic dianhydride (PMDA), benzophenonetetracarboxylic acid (BTDA), etc.

Curing agents other than the above: amide compounds such as dicyandiamide; polymercaptan compounds such as a polysulfide, a thioester, a thioether, etc.; isocyanate compounds such as an isocyanate prepolymer, a blocked isocyanate, etc.; organic acids such as carboxylic acid-containing polyester resins, etc.

Among these curing agents, as a curing agent to be used for semiconductor encapsulating materials, from the viewpoint of moisture resistance, reliability, etc., preferred is a compound having at least two phenolic hydroxyl groups in one molecule, and for example, a novolac type phenol resin such as a phenol novolac resin, a cresol novolac resin, a tert-butylphenol novolac resin or a nonylphenol novolak resin; a resole-type phenolic resin; a polyoxystyrene such as poly-p-oxy-styrene; a phenylene skeleton-containing phenol aralkyl resin, or a biphenylene skeleton-containing phenol aralkyl resin, may be mentioned.

A curing promoter to be used may be any one that promotes the curing reaction between the curing agent and the epoxy group, and it is possible to use one which is commonly used for semiconductor encapsulating materials. For example, a diazabicycloalkene or its derivative, such as 1,8-diazabicyclo(5,4,0)undecene-7; an amine compound such as tributylamine or benzyldimethylamine; an imidazole compound such as 2-methylimidazole; an organic phosphine such as triphenyl phosphine or methyl diphenyl phosphine; a tetra-substituted phosphonium tetra-substituted borate such as tetraphenylphosphonium-tetraphenyl borate, tetraphenylphosphonium tetra benzoic acid borate, tetraphenylphosphonium tetra naphthoic acid borate, tetraphenylphosphonium tetra naphthoyloxy borate, tetraphenyl phosphonium tetranaphthyloxy borate; or a triphenylphosphine having benzoquinone as an adduct, may be mentioned. These may be used alone, or in combination of two or more of them.

In the curable resin 40, it is possible to use an inorganic filler. Such an inorganic filler is not particularly limited as long as it is commonly used in a semiconductor encapsulation material, and, for example, silica such as fused crushed silica, fused spherical silica, crystalline silica or secondary aggregated silica; alumina; titanium white; aluminum hydroxide; talc; clay; mica; or glass fiber, may be mentioned.

In the curable resin 40, in addition to the above components, as the case requires, various additives may be incorporated, for example, a coupling agent such as 3-glycidoxypropyltrimethoxysilane; a coloring agent such as carbon black; a releasing agent such as natural wax, synthetic wax, a higher fatty acid or its metal salt, a paraffin or polyethylene oxide; a low-stress agent such as silicone oil or silicone rubber; an ion trapping agent such as hydrotalcite; a flame retardant such as aluminum hydroxide; an antioxidant; etc.

In the foregoing, an example of filling a solid one as the curable resin 40, has been illustrated, but the present invention is not limited to this, and a liquid curable resin may be filled.

As such a mixture, for example, in addition to SUMIKON EME G770H type F ver. GR manufactured by Sumitomo Bakelite Co., Ltd. to be used for the above test method B, a commercially available product of an epoxy resin such as T693/R4719-SP10 manufactured by Nagase ChemteX Corporation, may be mentioned.

As commercial products of a silicone resin, LPS-3412AJ and LPS-3412B manufactured by Shin-Etsu Chemical Co., Ltd., may, for example, be mentioned.

Figure 3:
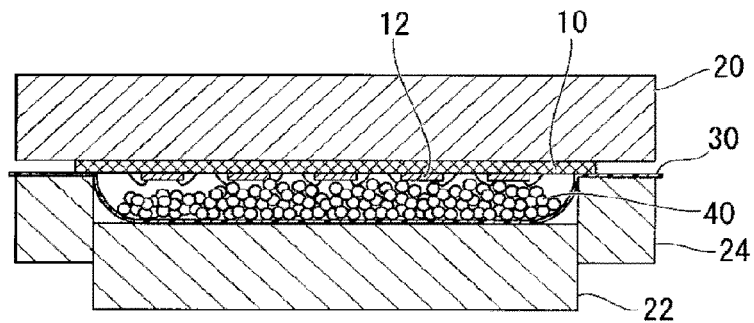
FIG. 3 is a cross-sectional view illustrating schematically the step ($\alpha$4) in the first embodiment of the process for producing a semiconductor package of the present invention.

Step (α4):

As shown in FIG. 3, in such a state that the curable resin 40 is filled on the mold release film 30 in the cavity 26, the cavity bottom member 22 and the movable lower mold 24 are raised and clamped to the stationary upper mold 20 for mold clamping.

Figure 4:
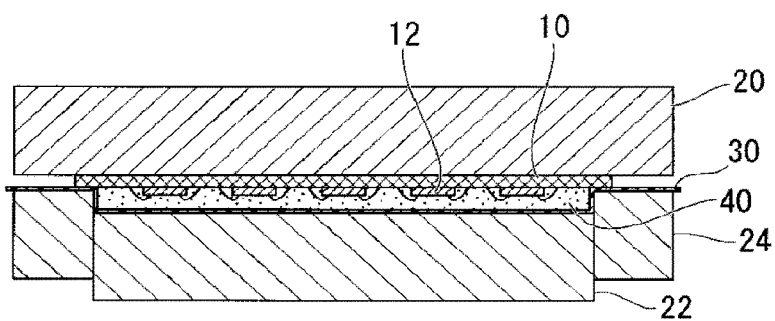
FIG. 4 is a cross-sectional view illustrating schematically the step ($\alpha$4) in the first embodiment of the process for producing a semiconductor package of the present invention.

Then, as shown in FIG. 4, only the cavity bottom member 22 is raised and at the same time, the mold is heated to let the curable resin 40 be cured to form a resin-encapsulation portion 14 for encapsulating the semiconductor chips 12.

In the step (α4), by the pressure at the time of raising the cavity bottom member 22, the curable resin 40 filled in the cavity 26 is further pushed to the cavity surface. The mold release film 30 is thereby stretched and deformed to be closely in contact with the cavity surface. Therefore, the resin-encapsulation portion 14 having a shape corresponding to the shape of the cavity 26 will be formed.

The heating temperature of the mold, i.e. the heating temperature of the curable resin 40 is preferably from 100 to 185° C., particularly preferably from 140 to 175° C. When the heating temperature is at least the lower limit value in the above range, the productivity of the semiconductor package 1 is improved. When the heating temperature is at most the upper limit value in the above range, deterioration of the curable resin 40 is prevented.

From the viewpoint of suppressing a change in the shape of the resin-encapsulation portion 14 due to thermal expansion of the curable resin 40, when the protection of the semiconductor package 1 is particularly required, the heating is preferably conducted at the lowest possible temperature within the above range.

Step (α5):

The stationary upper mold 20, the cavity bottom member 22 and the movable lower mold 24 are mold-opened, and the collectively encapsulated product is taken out.

At the same time as releasing the collectively encapsulated product, the used portion of the mold release film 30 is sent to the winding roll (not shown), and the unused portion of the mold release film 30 is fed from the unwinding roll (not shown).

The thickness of the mold release film 30 at the time of being transported from the unwinding roll to the winding roll is preferably at least 16 μm. If the thickness is less than 16 μm, wrinkling is likely to occur during the transportation of the mold release film 30. If wrinkles are formed in the mold release film 30, such wrinkles are likely to be transferred to the resin-encapsulation portion 14, thus leading to a defective product. When the thickness is at least 16 μm, it is possible to apply a sufficient tension to the mold release film 30 so as to prevent formation of wrinkles.

Step (α6):

The substrate 10 and the resin-encapsulation portion 14 of the collectively encapsulated product taken out from the mold, are cut (singulated) so that the plurality of semiconductor chips 12 are separated, to obtain singulated encapsulated products each comprising a substrate 10, at least one semiconductor chip 12 and a resin-encapsulation portion for sealing the semiconductor chip 12.

Such singulation can be carried out by a known method, such as a dicing method. The dicing method is a method of cutting an object by rotating a dicing blade. As the dicing blade, typically a rotating blade (diamond cutter) having diamond powder sintered on the outer periphery of a disk, is used. Singulation by the dicing method can be carried out, for example, by a method wherein the collectively encapsulated product as an object to be cut, is fixed on the processing table via a jig, and the dicing blade is permitted to rum in such a state that a space to insert the dicing blade is present between the jig and the cutting area of the object to be cut.

In the step (α6), after the step (cutting step) of cutting the collectively encapsulated product as described above, there may be included a foreign matter-removing step of moving the processing table while supplying a liquid to the cutting object from a nozzle disposed at a position apart from the case for covering the dicing blade.

Step (α7):

On the upper surface 14a (the surface which was in contact with the mold release film 30) of the resin-encapsulation portion 14 of the singulated encapsulated product obtained in step (α6), an ink is applied to form an ink layer 16 in order to display an optional information, to obtain a semiconductor package 1.

The information to be displayed by the ink layer 16 is not particularly limited, and a serial number, information about the manufacturer, a type of components, etc., may be mentioned.

The method for applying the ink is not particularly limited, and for example, various printing methods may be mentioned, such as ink jet printing, screen printing, transfer from a rubber plate, etc.

The ink is not particularly limited and may be suitably selected from known inks.

As a method for forming the ink layer 16, in view of a high curing speed, less bleeding on the package, and little positional displacement of the package as no hot air is applied, a method is preferred wherein a photocurable ink is used, and the ink is applied by an ink-jet method on the upper surface 14a of the resin-encapsulation portion 14 and cured by irradiation with light.

As the photocurable ink, typically, one containing a polymerizable compound (monomer, oligomer, etc.) may be used. To the ink, as the case requires, a coloring material such as a pigment or a dye, a liquid medium (solvent or dispersant), a polymerization inhibitor, a photopolymerization initiator, other various additives, etc. may be added. Other additives include a slip agent, a polymerization accelerator, a penetration enhancer, a wetting agent (humectant), a fixing agent, a fungicide, a preservative, an antioxidant, a radiation absorber, a chelating agent, a pH adjusting agent, a thickeners, etc.

As the light to cure the photocurable ink, ultraviolet ray, visible ray, infrared ray, electron beam or radiation may, for example, be mentioned.

As the light source for ultraviolet ray, a germicidal lamp, an ultraviolet fluorescent lamp, a carbon arc, a xenon lamp, a high-pressure mercury lamp for copying, a medium-pressure or high-pressure mercury lamp, a super high pressure mercury lamp, an electrodeless lamp, a metal halide lamp, an ultraviolet light emitting diode, an ultraviolet laser diode, or natural light, may, for example, be mentioned.

Light irradiation may be carried out under normal pressure or under reduced pressure. It may be carried out in air, or in an inert gas atmosphere such as a nitrogen atmosphere or carbon dioxide atmosphere.

Second Embodiment

Another embodiment of the process for producing a semiconductor package will be described in detail with reference to a case of producing a semiconductor package 1 shown in FIG. 1 by a transfer molding method.

The process for producing a semiconductor package of the present embodiment comprises the following steps (β1) to (β6) or steps (β1) to (β7).

(β1) A step of disposing the mold release film of the present invention, so that the mold release film covers the cavity of the mold, and the first surface of the mold release film faces the space in the cavity (so that the second surface faces the cavity surface).

(β2) A step of vacuum sucking the mold release film on the side of the cavity surface of the mold.

(β3) A step of disposing a substrate having a plurality of semiconductor elements mounted thereon, at a predetermined position in the cavity.

(β4) A step of filling a curable resin in the cavity, and collectively encapsulating the plurality of semiconductor elements by the curable resin, to form a resin-encapsulation portion, thereby to obtain a collectively encapsulated product comprising the substrate, the plurality of semiconductor elements mounted on the substrate and the resin-encapsulation portion for collectively encapsulating the plurality of semiconductor elements.

(β5) A step of taking out the collectively encapsulated product from the mold.

(β6) A step of cutting the substrate and the resin-encapsulation portion of the collectively encapsulated product so that the plurality of semiconductor elements are separated, to obtain singulated encapsulated products each comprising a substrate, at least one semiconductor element mounted on the substrate and a resin-encapsulation portion for sealing the semiconductor element.

(β7) A step of forming an ink layer by using an ink on the surface which was in contact with the mold release film, of the resin-encapsulation portion of the singulated encapsulated product, to obtain a semiconductor package.

Figure 5:
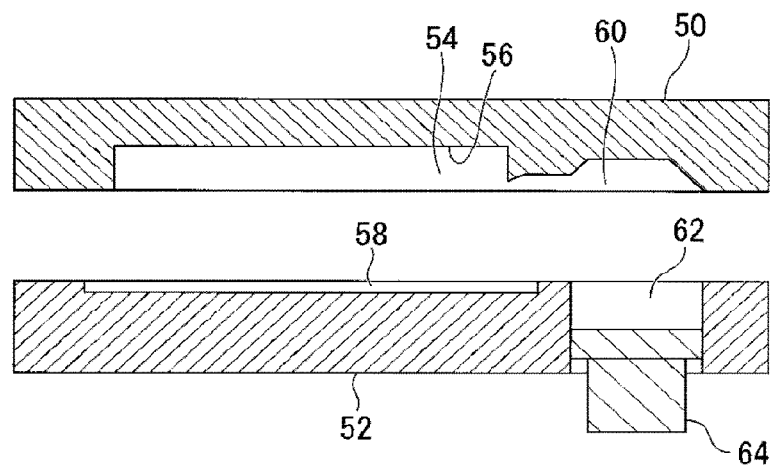
FIG. 5 is a cross-sectional view showing an example of a mold used in the second embodiment of the process for producing a semiconductor package of the present invention.

Mold:

As the mold in the second embodiment, it is possible to use one known as a mold to be used for a transfer molding method, and for example, as shown in FIG. 5, a mold comprising an upper mold 50 and a lower mold 52, may be mentioned. In the upper mold 50, a cavity 54 having a shape corresponding to the shape of the resin-encapsulation portion 14 to be formed in the step (α4), and a concave-shaped resin-introducing portion 60 to introduce a curable resin 40 to the cavity 54 are formed. In the lower mold 52, a substrate placement portion 58 for placing a substrate 10 having semiconductor chips 12 mounted thereon, and a resin placement portion 62 for placing a curable resin 40 are formed. Further, in the resin placement portion 62, a plunger 64 is provided that pushes the curable resin 40 to the resin introducing portion 60 of the upper mold 50.

Figure 6:
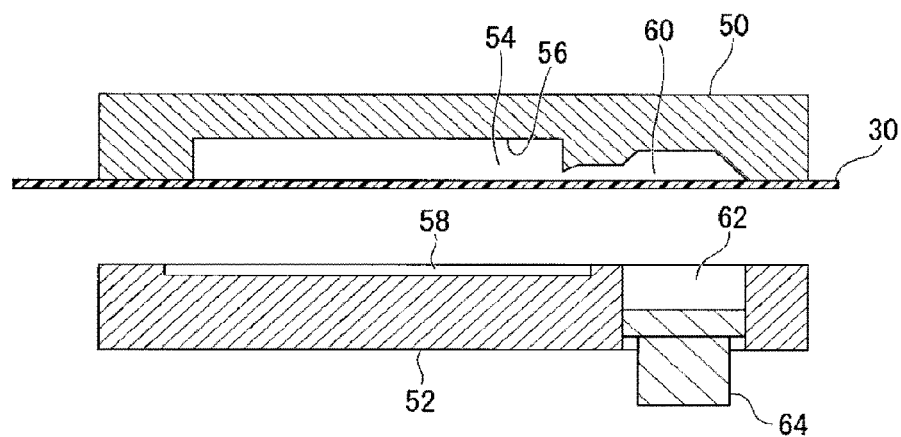
FIG. 6 is a cross-sectional view showing the step ($\beta$1) in the second embodiment of the process for producing a semiconductor package of the present invention.

Step (β1):

As shown in FIG. 6, the mold release film 30 is disposed to cover the cavity 54 of the upper mold 50. The mold release film 30 is preferably disposed so as to entirely cover the cavity 54 and the resin introducing portion 60. The mold release film 30 is pulled by the unwinding roll (not shown) and the winding roll (not shown), whereby it is disposed to cover the cavity 54 of the upper mold 50 in the stretched state.

Figure 7:
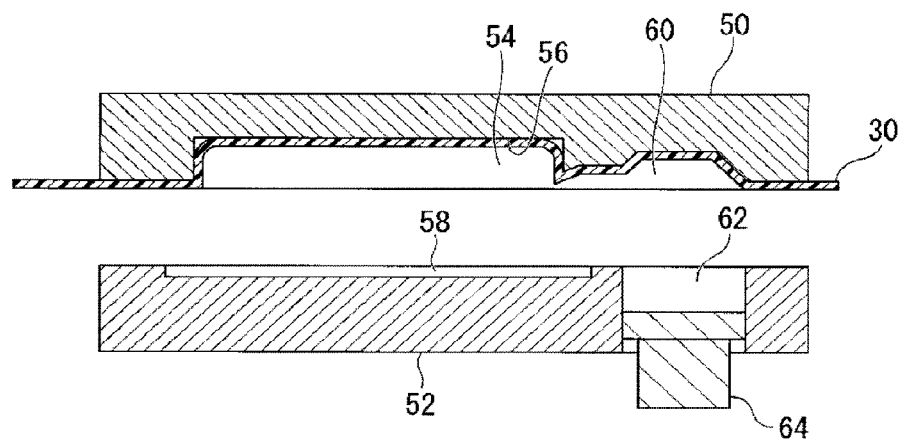
FIG. 7 is a cross-sectional view showing the step ($\beta$2) in the second embodiment of the process for producing a semiconductor package of the present invention.

Step (β2):

As shown in FIG. 7, by vacuum suction through a groove (not shown) formed outside of the cavity 54 of the upper mold 50, the space between the mold release film 30 and the cavity surface 56, and the space between the mold release film 30 and the inner wall of the resin introducing portion 60, are depressurized, so that the mold release film 30 is stretched, deformed and vacuum-adsorbed to the cavity surface 56 of the upper mold 50.

Here, the mold release film 30 may not always be in close contact with the cavity surface 56, depending upon the strength and thickness of the mold release film 30 in a high temperature environment and the shape of the cavity 54. As shown in FIG. 7, at the stage of the vacuum suction step (β2), a void space remains a little between the mold release film 30 and the cavity surface 56.

Figure 8:
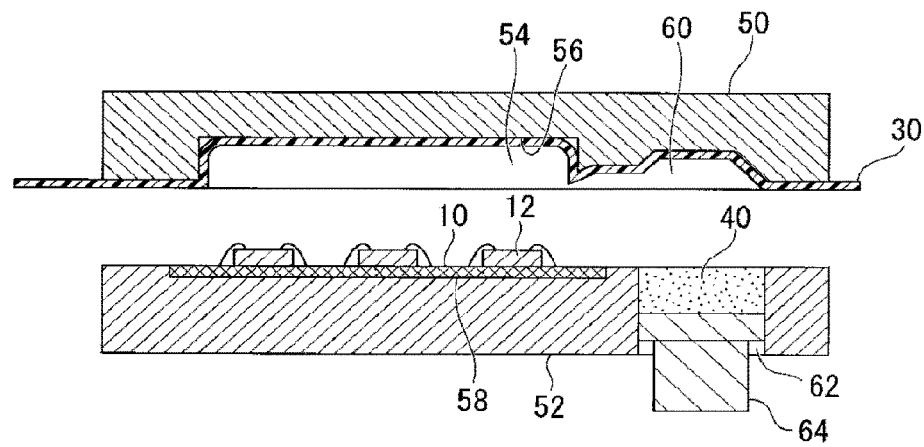
FIG. 8 is a cross-sectional view showing the step ($\beta$3) in the second embodiment of the process for producing a semiconductor package of the present invention.

Step (β3):

As shown in FIG. 8, the substrate 10 having the plurality of semiconductor chips 12 mounted thereon is placed on the substrate placement portion 58, and the upper mold 50 and the lower mold 52 are clamped so that the plurality of semiconductor chips 12 are disposed at a predetermined position in the cavity 54. Further, on the plunger 64 of the resin placement portion 62, the curable resin 40 is disposed in advance.

The curable resin 40 may be the same one as the curable resin 40 mentioned in the method (α).

Figure 9:
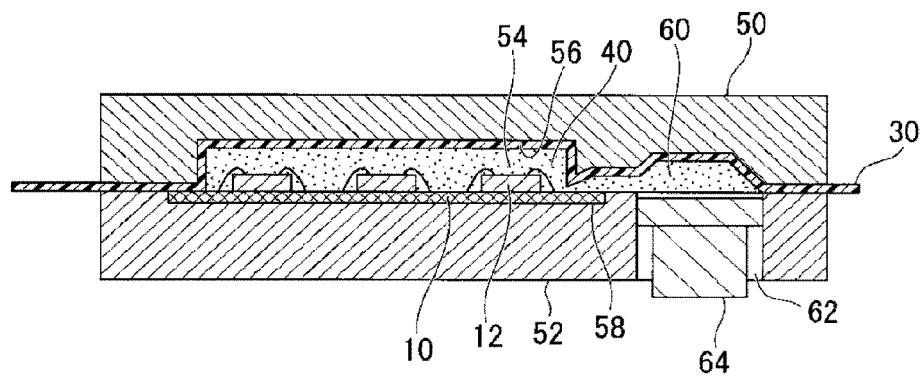
FIG. 9 is a cross-sectional view showing the step ($\beta$4) in the second embodiment of the process for producing a semiconductor package of the present invention.

Step (β4):

As shown in FIG. 9, the plunger 64 of the lower mold 52 is pushed up to fill the curable resin 40 into the cavity 54 through the resin introducing portion 60. Then, the mold is heated to cure the curable resin 40, thereby to form the resin-encapsulation portion 14 for encapsulating the plurality of semiconductor chips 12.

In the step (β4), as the curable resin 40 is filled into the cavity 54, the mold release film 30 is further pushed to the cavity surface 56 side by the resin pressure and deformed so that it will be in close contact with the cavity surface 56. Therefore, a resin-encapsulation portion 14 having a shape corresponding to the shape of the cavity 54 will be formed.

The heating temperature of the mold at the time of curing the curable resin 40, namely the heating temperature of the curable resin 40, is preferably within the same range as the temperature range in the method (a).

The resin pressure at the time of filling the curable resin is preferably from 2 to 30 MPa, particularly preferably from 3 to 10 MPa. When the resin pressure is at least the lower limit value in the above range, a drawback such as deficiency in filling the curable resin 40 is unlikely to occur. When the resin pressure is at most the upper limit value in the above range, it is easy to obtain a semiconductor package 1 of excellent quality. The resin pressure of the curable resin 40, can be adjusted by the plunger 64.

Figure 10:
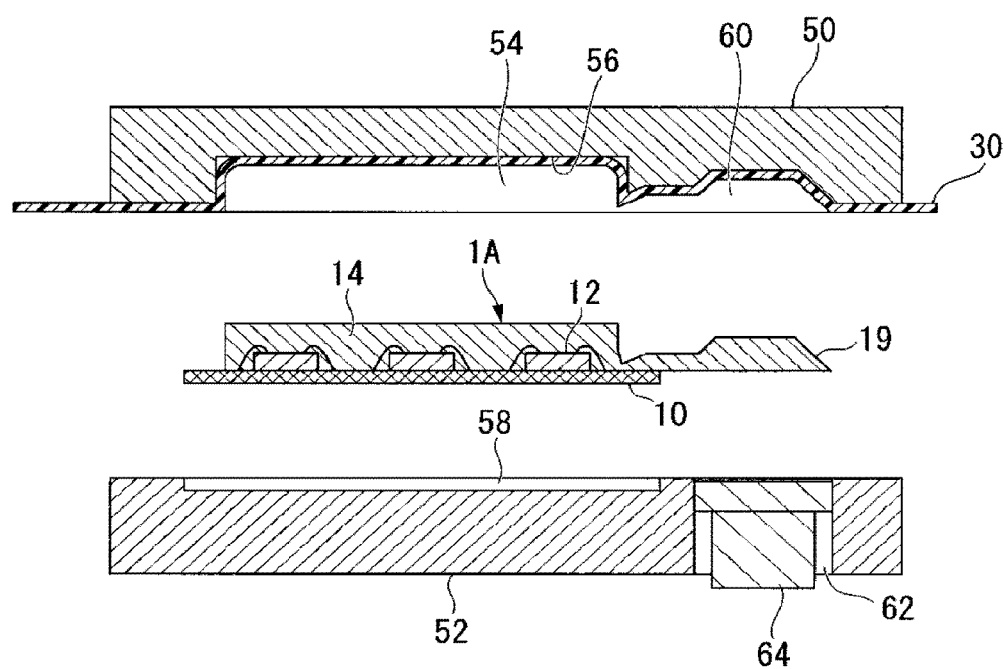
FIG. 10 is a cross-sectional view showing the step ($\beta$5) in the second embodiment of the process for producing a semiconductor package of the present invention.

Step (β5):

As shown in FIG. 10, the collectively encapsulated product 1A is taken out from the mold. At that time, the cured product 19 of the curable resin 40 cured in the resin introducing portion 60 is taken out from the mold along with the collectively encapsulated product 1A in such a state as attached to the collectively encapsulated product 1A. Therefore, by cutting away the cured product 19 attached to the collectively encapsulated product 1A, the collectively encapsulated product 1A is obtained.

Step (β6):

The substrate 10 and the resin-encapsulation portion 14 of the collectively encapsulated product 1A obtained in step (β5) are cut (singulated) so that the plurality of semiconductor chips 12 are separated, to obtain singulated encapsulated products each comprising a substrate 10, at least one semiconductor chip 12 and a resin-encapsulation portion for encapsulating the semiconductor chip 12.

The step (β6) may be carried out in the same manner as the step (α6).

Step (β7):

On the upper surface 14a (the surface which was in contact with the first surface of the mold release film 30) of the resin-encapsulation portion 14 of the obtained singulated encapsulated product, in order to display an optional information, an ink is applied to form an ink layer 16 to obtain a semiconductor package 1.

The step (β7) may be carried out in the same manner as the step (α7).

In the foregoing, the process for producing a semiconductor package of the present invention has been described with reference to the first and second embodiments, but the present invention is by no means limited to the above embodiments. The respective constructions and their combinations in the above embodiments are only examples, and within a range not departing from the gist of the present invention, additions, omissions, substitutions and other modifications are possible.

For example, in the first embodiment, a case was shown wherein after the step (α5), the steps (α6) and (α7) are carried out in this order, but the steps (α6) and (α7) may be carried out in the reverse order. That is, an ink layer may be formed by using an ink on the surface of the resin-encapsulation portion of the collectively encapsulated product taken out from the mold, which was in contact with the mold release film, and then, the substrate and the resin-encapsulation portion of the collectively encapsulated product may be cut.

Similarly, in the second embodiment, a case was shown wherein after the step (β5), the steps (β6) and (β7) are carried out in this order, but the steps (β6) and (β7) may be carried out in the reverse order. That is, an ink layer may be formed by using an ink on the surface of the resin-encapsulation portion of the collectively encapsulated product taken out from the mold, which was in contact with the mold release film, and then, the substrate and the resin-encapsulation portion of the collectively encapsulated product may be cut.

The timing of peeling off the resin-encapsulation portion from the mold release film, is not limited to at the time of taking out the resin-encapsulation portion from the mold, but the resin-encapsulation portion may be taken out together with the mold release film from the mold and then, the mold release film may be peeled off from the resin-encapsulation portion.

The distances between the plurality of semiconductor chips 12 to be collectively encapsulated may be uniform or may not be uniform. It is preferred to equalize the distances between the plurality of semiconductor chips 12, since encapsulation can thereby be made uniformly, and a load may be applied uniformly on the plurality of semiconductor chips 12, respectively.

Further, the semiconductor package to be produced by the process for producing a semiconductor package of the present invention is not limited to the semiconductor package 1.

For example, the shape of the resin-encapsulation portion is not limited to the substantially rectangular cross-section as shown in FIG. 1.

In the first or second embodiment, after the step (α5) or (β5), without conducting the step (α6) or (β6), an ink layer may be formed by using an ink on the surface of the resin-encapsulation portion of the collectively encapsulated product taken out from the mold, which was in contact with the mold release film, to obtain a semiconductor package.

In the step (α3) or (β3) in the first or second embodiment, instead of the substrate having the plurality of semiconductor elements mounted thereon, a substrate having one semiconductor element mounted may be used. In this case, after taking out an encapsulated product obtained in the step (α4) or (β4) from the mold, an ink layer may be formed by using an ink on the surface of the resin-encapsulation portion of the encapsulated product, which was in contact with the release film, to obtain a semiconductor package.

Further, in the embodiment without the ink layer, the semiconductor package in the present invention may be a light emitting diode. When producing the light-emitting diode, since the resin-encapsulation portion functions also as a lens portion, usually, no ink layer is formed on the surface of the resin-encapsulation portion. When it is a lens portion, as the shape of the resin-encapsulation portion, various lenses shapes may be employed, such as substantially hemispherical, bullet-shaped, Fresnel lens type, semi-cylindrical, substantially hemispherical lens array type, etc.

EXAMPLES

Hereinafter, the present invention will be described in detail with reference to Examples. However, the invention is not limited by the following description.

Among the following Ex. 1 to 10, Ex. 1, 2, 4, 8 and 10 are Examples of the present invention, and Ex. 3, 5 to 7 and 9 are Comparative Examples.

The materials and evaluation methods used in Examples are shown below.

[Materials Used]

Fluororesin (1): copolymer obtained in Production Example 1 given below, E/TFE/PFBE=52.7/46.5/0.8 (molar ratio) (melting point: 260° C., glass transition temperature: 95° C., MFR: 10.1 g/10 min).

Fluororesin (2): copolymer obtained in Production Example 2 given below, E/TFE/PFBE=52.5/46.3/1.2 (molar ratio) (melting point: 255° C., glass transition temperature: 90° C., MFR: 12 g/10 min).

Fluororesin (3): copolymer obtained in Production Example 3 given below, E/TFE/PFBE=52.7/45.4/1.9 (molar ratio) (MFR: 27.6 g/10 min).

Fluororesin (4): copolymer obtained in Production Example 4 given below, TFE/PPVE=98.5/1.5 (molar ratio) (melting point: 310° C., glass transition temperature: 100° C., MFR: 12 g/10 min).

Fluororesin (5): copolymer obtained in Production Example 5 given below, TFE/E/PFBE=52.7/47.1/0.2 (molar ratio) (melting point: 265° C., glass transition temperature: 100° C., MFR: 10.6 g/10 min).

Fluororesin (6): copolymer obtained in Production Example 6 given below, TFE/E/PFBE=56.3/40.2/3.5 (molar ratio) (melting point: 225° C., glass transition temperature: 70° C., MFR: 12.5 g/10 min).

Production Example 1: Production of Fluororesin (1)

A polymerization tank having an internal capacity of 1.3 L and equipped with a stirrer, was deaerated; 881.9 g of 1-hydrotridecafluoro-hexane, 335.5 g of 1,3-dichloro-1,1,2,2,3-pentafluoropropane (trade name "AK225cb" manufactured by Asahi Glass Company, Limited, hereinafter referred to as AK225cb) and 3.9 g of $CH_2=CHCF_2CF_2CF_3$ (PFBE), were charged; 165.2 g of TFE and 9.8 g of ethylene (hereinafter referred to as E) were injected; the temperature in the polymerization tank was raised to 66° C.; and as a polymerization initiator solution, 5.8 mL of an AK225cb solution containing 1 mass % of tert-butyl peroxypivalate (hereinafter referred to as PBPV) was charged to initiate the polymerization.

A monomer mixture gas of TFE/E=54/46 by molar ratio was continuously charged so that the pressure would be constant during the polymerization. Further, along with the charging of the monomer mixture gas, PFBE was continuously charged in an amount corresponding 0.8 mol % to the total number of moles of TFE and E. After 2.9 hours from the initiation of the polymerization, at the time when 100 g of the monomer mixture gas was charged, the inside temperature of the polymerization tank was lowered to room temperature, and at the same time, the pressure of the polymerization tank was purged to normal pressure.

Thereafter, the obtained slurry was suction filtered through a glass filter, and a solid content was recovered and dried at 150° C. for 15 hours to obtain 105 g of a fluororesin (1).

Production Example 2: Production of Fluororesin (2)

107 g of a fluororesin (2) was obtained in the same manner as in Production Example 1 except that the amount of PFBE charged prior to initiating polymerization was changed from 3.9 g to 7.0 g, the amount of the AK225cb solution containing 1% by weight of PBPV was changed from 5.8 mL to 7.7 mL, and the amount of PFBE continuously charged during the polymerization was changed from 0.8 mol % to 1.4 mol % to the total number of moles of TFE and E.

Production Example 3: Production of Fluororesin (3)

99 g of a fluororesin (3) was obtained in the same manner as in Production Example 1 except the amount of 1-hydrotridecafluoro-hexane charged prior to initiating polymerization was changed from 881.9 g to 837.8 g, the amount of AK225cb was changed from 335.5 g to 376.4 g, the amount of PFBE was changed from 7.0 g to 9.3 g, the amount of the AK225cb solution containing 1 mass % of PBPV was changed from 5.8 mL to 11.5 mL, the amount of PFBE continuously charged during the polymerization (relative to the total number of moles of TFE an d E) was changed from 0.8 mol % to 2.2 mol %, and the time from the initiation of the polymerization till 100 g of the monomer mixture gas was charged, was changed from 2.9 hours to 27 hours.

Production Example 4: Production of Fluororesin (4)

A polymerization tank having an internal capacity of 1.3 L and equipped with a stirrer, was deaerated and purged with nitrogen; 662.8 g of ion exchanged water, 377.5 g of AK225cb, 28 g of $CF_2=CFOCF_2CF_2CF_3$ (PPVE) and 61 g of methanol, were charged; 105 g of TFE was injected; the temperature in the polymerization tank was raised to 66° C.; and as a polymerization initiator solution, 3.8 mL of an AK225cb solution containing 0.05 mass % of heptafluorobutyroyl peroxide (hereinafter referred to as PFB) was charged to initiate the polymerization.

A monomer gas of TFE was continuously charged so that the pressure would be constant during the polymerization. Further, so that the polymerization rate would be constant, an AK225cb solution containing 0.05 mass % of PFB and 2 mass % of PPVE was continuously charged in an amount of 24 mL. After 3.4 hours from the initiation of polymerization, at the time when 160 g of the monomer gas was charged, the inside temperature of the polymerization tank was lowered to room temperature, and at the same time, the pressure of the polymerization tank was purged to normal pressure.

Thereafter, the obtained slurry was suction filtered through a glass filter, and a solid content was recovered and dried at 150° C. for 15 hours to obtain 170 g of a fluororesin (4).

Production Example 5: Production of Fluororesin (5)

90 g of a fluororesin (5) was obtained in the same manner as in Production Example 1 except that the internal capacity of the polymerization tank was made to be 1.2 L, the amount of 1-hydrotridecafluoro hexane charged prior to the initiation of polymerization was changed from 881.9 g to 0 g, the amount of AK225cb was changed from 335.5 g to 291.6 g, the amount of PFBE was changed from 7.0 g to 16.0 g, the amount of TFE was changed from 165.2 g to 186.6 g, the amount of E was changed from 9.8 g to 6.4 g, the amount of the AK225cb solution containing 1 mass % of PBPV was changed from 5.8 mL to 5.3 mL, the molar ratio of TFE/E in the monomer mixture gas continuously charged during the polymerization was changed from 54/46 to 58/42, the amount of PFBE (to the total number of moles of TFE and E) was changed from 0.8 mol % to 3.6 mol %, and after 3 hours from the initiation of polymerization, at the time when 90 g of the monomer mixture gas was charged, the inside temperature of the polymerization tank was lowered to room temperature.

Production Example 6: Production of Fluororesin (6)

90 g of a fluororesin (6) was obtained in the same manner as in Production Example 5 except that the amount of PFBE charged prior to the initiation of polymerization was changed from 16.0 to 1.1 g, the amount of TFE was changed from 186.6 g to 151.2 g, the amount of E was changed from 6.4 g to 18.1 g, the molar ratio of TFE/E in the monomer mixture gas continuously charged during polymerization was changed from 58/42 to 54/46, and the amount of PFBE (relative to the total number of moles of TFE and E) was changed from 3.6 mol % to 0.2 mol %.
[Evaluation Methods]
(MFR)

MFR of each of the fluororesins (1) to (3), (5) and (6) was measured under a load of 49 N at 297° C. in accordance with ASTM D3159.

Further, MFR of the fluororesin (4) was measured under a load of 49 N at 372° C. in accordance with ASTM D3307.
(Melting Point)

The melting point was obtained from the endothermic peak at the time when each fluororesin was heated in an air atmosphere to 350° C. at a rate of 10° C./min by means of a scanning differential thermal analyzer (manufactured by SII Nanotechnologies, Inc., DSC220CU).
(Glass Transition Temperature)

The temperature at which tan δ (E"/E') i.e. the ratio of the loss modulus E" to the storage modulus E' as measured in accordance with ISO6721-4: 1994 (JIS K7244-4: 1999) takes the maximum value, was adopted. Specifically, the measurement was carried out by a dynamic viscoelasticity measuring device Solid L-1 (manufactured by Toyo Seiki Co., Ltd.).

Sample size: 8 mm in width×20 mm in length
Measurement frequency: 10 Hz
Strain: 0.035%
Heating rate: 2° C./min
(Measurement of Thickness of Film)

Measured in accordance with ISO4591: 1992 (JIS K7130: 1999 B1 Method).
<Measurement of F/(C+F+O)>

On a square-shaped first metal plate of a size of 15 cm×15 cm with a thickness of 3 mm, a square-shaped aluminum foil of a size of 15 cm×15 cm with a thickness of 100 μm was placed, on said aluminum foil, a square-shaped spacer (material: polyimide) of a size of 15 cm×15 cm with a thickness of 100 mm and having, at its center, a rectangular hole of 10 cm×8 cm opened, was placed, in the vicinity of the center of the hole, an epoxy granular resin (trade name: SUMIKON EME G770H type F ver. GR, manufactured by Sumitomo Bakelite Co., Ltd.) for encapsulating semiconductors was placed in an amount of 2 g, further thereon, a square-shaped mold release film of a size of 15 cm×15 cm, was placed so that the first surface was directed to the spacer side, and thereon, a square-shaped second metal plate of a size of 15 cm×15 cm with a thickness of 3 mm was placed to prepare a laminated sample.

This laminated sample was put in a press machine (50 t press, the press area 45 cm×50 cm) heated at 180° C. and was pressed under a pressure of 10 MPa for 5 minutes.

After the pressing, the second metal plate, the mold release film and the spacer were removed. Thus, an evaluation sample having the first metal plate, the aluminum foil and the epoxy resin plate (cured) laminated was obtained.

The epoxy resin surface of the obtained evaluation sample (the surface which was in contact with the first surface of the mold release film during the preparation of the evaluation sample) was analyzed by an X-ray photoelectron spectroscopy (XPS). From the analytical results, the ratio (F/(C+F+O)) of fluorine atoms (atomic %) to the sum of carbon atoms (atomic %), fluorine atoms (atomic %) and oxygen atoms (atomic %) at the surface was obtained.

In XPS, an X-ray photoelectron spectrometer, QuanteraSXM model, manufactured by ULVAC-PHI, Inc. was used. As the X-ray source, a monochromatic AlKα ray was used at 15 kV and 25 W, the X-ray irradiation surface photoelectron detection angle was set to be 45 degrees, and the Pass Energy of photoelectrons was set to be 224 eV. Here, C, F and O in the formula F/(C+F+O) were, respectively, calculated from the measured values of the peak areas of C1s, F1s and O1s measured by this method.
<Evaluation of Ink Adhesion>

An evaluation sample having the first metal plate, a polyimide film and the epoxy resin plate laminated, was prepared in the same manner as in the above <Measurement of F/(C+F+O)> except that instead of the aluminum foil, a square-shaped polyimide film of a size of 15 cm×15 cm (trade name: UPILEX 125S, manufactured by Ube Industries, Ltd.) with a thickness of 125 μm, was used.

An ultraviolet (UV) curable ink (product number: 4466, manufactured by Markem-Imaje) was diluted to 3 times with ethyl acetate. The diluted ink was applied to the epoxy resin surface of the evaluation sample (the surface which was in contact with the first surface of the mold release film during the preparation of the evaluation sample) by using a bar coater #3. The coating amount was set to be 1 g/m². After the coating, the evaluation sample was put in a hot air oven of 100° C. and dried for 3 minutes.

The evaluation sample having the aforementioned ink applied and dried, was irradiated with UV under a condition of 3 kW for 10 seconds in an UV irradiation device, to cure the ink thereby to form an ink layer.

The adhesion of the formed ink layer to the epoxy resin surface was evaluated based on ISO2409 (JIS K5600-5-6-2009). From the results, the ink adhesion was evaluated by the following standards. ⊚ and ○ are evaluation standards for practically acceptable levels.

⊚ (excellent): no peeling is observed in any eye of the grid.
○ (good): peeling is observed in part of the grid.
Δ (poor): peeling is observed in more than 50% of the grid.
× (no good): peeling is observed on the entire surface.
<Evaluation of Releasability>

In accordance with JIS K6854-2: 1999, a 180 degree peel test between a mold release film and a thermosetting epoxy resin was carried out as follows, to measure the peel force. The smaller the peel force, the better the releasability.

(a) In the same manner as in <Measurement of F/(C+F+O)>, an evaluation sample having the first metal plate, the aluminum foil and the epoxy resin plate (cured) laminated, was obtained.

(b) The evaluation sample was cut to be 25 mm in width.

(c) Using the above evaluation sample of 25 mm in width, the 180 degree peel force between the mold release film and the thermosetting epoxy resin at room temperature was measured at a rate of 100 mm/min using a tensile testing machine (RTC-131-A manufactured by Orientec Co.).

(d) In the force (N)-grasping moving distance curve, the average value of the peel force from the grasp moving distance of from 25 mm to 125 mm was obtained.

(e) The arithmetic mean of the average values (unit: N/cm) of the peel force of five evaluation samples was obtained.

(Measurement of F/Al)

On a 1 mm thick cardboard (size: 5 cm×10 cm), a 0.1 mm thick aluminum plate (size: 5 cm×10 cm) made of A1N30H-H18 material in JIS H4160, was placed, thereon, a mold release film (size: 5 cm×10 cm) was placed so that the first surface was directed to the lower side (the aluminum plate side), and thereon (first surface side), a 1 mm thick cardboard (size: 5 cm×10 cm) was further placed to obtain a laminated sample. The laminated sample was put in a press machine (50 t press, press area: 45 cm×50 cm) heated at 180° C. and pressed under a pressure of 5 MPa for 5 minutes. After the pressing, the cardboards on both sides were removed, the mold release film was peeled from the aluminum plate, and the surface of the aluminum plate that was in contact with the mold release film was analyzed by an X-ray photoelectron spectroscopy (XPS). From the results of the analysis, the ratio (F/Al) of fluorine atoms (atomic %) to aluminum atoms (atomic %) at the surface was obtained.

In XPS, an X-ray photoelectron spectroscopy apparatus, Quantera SXM model manufactured by ULVAC-PHI Inc. was used. As the X-ray source, monochromatic AlKα ray was used at 15 kV and 25 W, the X-ray irradiation surface photoelectron detection angle was set to be 45 degrees, and the Pass Energy of photoelectrons was set to be 224 eV. Further, F/Al was calculated from the measured values of F1s and Al1s as measured by this method.

(Contamination Evaluation (Substitute Test))

On a 1 mm thick cardboard (size: 13 cm×13 cm), a 1 mm thick mirror-treated stainless steel plate (made of SUS 303, 13 cm×13 cm) was placed so that the mirror-treated surface (60° specular gloss: 680) was directed to the upper side (opposite side to the cardboard), thereon, the mold release film (size: 13 cm×13 cm) was placed so that the first surface was directed to the lower side (the stainless steel plate side), and thereon (the first surface side), a 1 mm thick cardboard (size: 13 cm×13 cm) was further placed to obtain a laminated sample. The laminated sample was put in a press machine (50 t press, press area: 45 cm×50 cm) heated at 180° C. and pressed under a pressure of 1 MPa for 5 minutes. After the pressing, the cardboards on both sides were removed, the mold release film was peeled from the stainless steel plate, and the 60° specular gloss of the mirror-treated surface of the stainless steel plate (the surface that was in contact with the mold release film) was measured.

The above test was repeated until the 60° specular gloss of the mirror-treated surface of the stainless steel plate (the surface that was in contact with the mold release film) became at most 500. The greater the number of tests, the less likely the contamination at the other side (the cavity surface of the mold or the surface of the resin-encapsulation portion) in contact with the mold release film.

The 60° specular gloss of the mirror-treated surface of the stainless steel plate was measured by a gloss meter PG-1M manufactured by Nippon Denshoku Industries Co., Ltd. in accordance with ISO7668: 1984.

Ex. 1

The fluororesin (1) was melt-extruded at 320° C. by an extruder having a lip adjusted to bring the thickness to be 50 μm, to produce a fluororesin film having a thickness of 50 μm, which was regarded as a mold release film of Ex. 1. F/(C+F+O) of the mold release film was measured, and the result is shown in Table 1.

Further, F/Al of the mold release film was measured, and the result is shown in Table 2.

The production conditions for the fluororesin film were as follows.

Extruder conditions: extruder cylinder diameter 65 mm, rotation speed 20 rpm, screw metering section groove depth 0.5 cm, metering section shear rate 14 s$^{-1}$, L/D=26, L (metering section)/D=8.

Take-off conditions: metal mirror surface roll (Ra 0.05, surface temperature 180° C.), pressing rubber roll (Shore D hardness of 70, surface temperature of 180° C., press pressure 98 N/cm)

Vent Conditions: a vent was provided in the compression section, and the pressure of the vent line was set to be 500 Pa.

Ex. 2

In the same manner as in Ex. 1 except that the fluororesin (2) was used as the fluororesin, a fluororesin film having a thickness of 50 μm was produced, which was regarded as a mold release film of Ex. 2. F/(C+F+O) of the mold release film was measured, and the result is shown in Table 1.

Further, F/Al of the mold release film was measured, and the result is shown in Table 2.

Ex. 3

In the same manner as in Ex. 1 except that the fluororesin (3) was used as the fluororesin, a fluororesin film having a thickness of 50 μm was produced, which was regarded as a mold release film of Ex. 3. F/(C+F+O) of the mold release film was measured, and the result is shown in Table 1.

Further, F/Al of the mold release film was measured, and the result is shown in Table 2.

Ex. 4

The fluororesin film in Ex. 3 was immersed in ASAHIKLIN AK225 (manufactured by Asahi Glass Company, Limited) and left for three days under the condition of 40° C., and then, it was further washed with clean ASAHIKLIN AK225 and dried at 60° C. for 1 hour. This film was regarded as a mold release film of Ex. 4. F/(C+F+O) of the mold release film was measured, and the result is shown in Table 1.

Further, F/Al of the mold release film was measured, and the result is shown in Table 2.

Ex. 5

In the same manner as in Ex. 1 except that the fluororesin (4) was used as the fluororesin, and the melt extrusion temperature was changed to 380° C., a fluororesin film having a thickness of 50 μm was produced, which was regarded as a mold release film of Ex. 5. F/(C+F+O) of the mold release film was measured, and the result is shown in Table 1.

Further, F/Al of the mold release film was measured, and the result is shown in Table 2.

Ex. 6

In the same manner as in Ex. 1 except that the fluororesin (5) was used as the fluororesin, a fluororesin film having a thickness of 50 μm was produced, which was regarded as a mold release film of Ex. 6. F/(C+F+O) of the mold release film was measured, and the result is shown in Table 1.

Ex. 7

In the same manner as in Ex. 1 except that the fluororesin (6) was used as the fluororesin, a fluororesin film having a thickness of 50 μm was produced, which was regarded as a mold release film of Ex. 7. F/(C+F+O) of the mold release film was measured, and the result is shown in Table 1.

Ex. 8

The fluororesin film of Ex. 5 was subjected to the same treatment as in Ex. 4, and this film was regarded as a mold release film of Ex. 8. F/Al of the mold release film was measured, and the result is shown in Table 2.

Ex. 9

In the same manner as in Ex. 1 except that the film production conditions were changed to as shown below, a fluororesin film having a thickness of 50 μm was produced, which was regarded as a mold release film of Ex. 9. F/(C+F+O) of the mold release film was measured, and the result is shown in Table 1.

Further, F/Al of the mold release film was measured, and the result is shown in Table 2.

Here, the production conditions for the fluororesin film were as follows.

Extruder conditions: extruder cylinder diameter 65 mm, rotation speed 40 rpm, screw metering section groove depth 0.2 cm, metering section shear rate: 85 $s^{-1}$, L/D=26, L (metering section)/D=8.

Take-off conditions: metal mirror surface roll (Ra 0.05, surface temperature 90° C.), pressing rubber roll (Shore D hardness of 70, surface temperature of 90° C., press pressure 98 N/cm)

Vent conditions: no vent was provided.

Ex. 10

The film produced in Ex. 3 was fed and passed two times between the rolls under the following conditions.

Metal mirror roll (Ra 0.05, surface temperature 190° C.), pressing rubber roll (Shore D hardness of 80, surface temperature of 190° C., press pressure 294 N/cm)

This film was regarded as a mold release film of Ex. 10. F/(C+F+O) of the mold release film was measured, and the result is shown in Table 1.

Further, F/Al of the mold release film was measured, and the result is shown in Table 2.

With respect to the mold release films obtained in Ex. 1 to 7 and 9 to 10, evaluations of the ink adhesion and the releasability were conducted. The results are shown in Table 1.

In Table 1, "(3)*[1]" represents one obtained by subjecting the fluororesin (3) to the solvent extraction treatment, "(1)*[2]" represents a fluororesin having the same monomer unit composition as the fluororesin (1) but obtained by different production conditions, and "(3)*[3]" represents one obtained by subjecting the film of the fluororesin (3) to the roll transfer treatment.

As shown in the following results, the mold release films in Ex. 1, 2, 4 and 10 wherein F/(C+F+O) was from 0.1 to 0.3, were excellent in releasability from the epoxy resin plate (cured product of the curable resin). Further, the epoxy resin plates which were formed by using these mold release films were excellent in ink adhesion. On the other hand, epoxy resin plates which were formed by using the mold release films of Ex. 3, 5, 7 and 9 wherein F/(C+F+O) exceeded 0.3, were insufficient in ink adhesion. The mold release film of Ex. 6 wherein F/(C+F+O) was less than 0.1, was insufficient in the releasability from the epoxy resin plate.

TABLE 1

|  | Ex. | | | | | | | | |
| --- | --- | --- | --- | --- | --- | --- | --- | --- | --- |
|  | 1 | 2 | 3 | 4 | 5 | 6 | 7 | 9 | 10 |
| Fluororesin | (1) | (2) | (3) | (3)*[1] | (4) | (5) | (6) | (1)*[2] | (3)*[3] |
| F/(C + F + O) | 0.25 | 0.28 | 0.35 | 0.25 | 0.33 | 0.08 | 0.5 | 0.47 | 0.29 |
| Ink adhesion | ◉ | ○ | Δ | ◉ | Δ | ◉ | X | X | ○ |
| Peel force (N/cm) | 0.5 | 0.25 | 0.2 | 0.5 | 0.2 | 1 | 0.1 | 0.1 | 0.25 |

The contamination evaluation was conducted with respect to the mold release films obtained in Ex. 1 to 5 and 8 to 9. The results are shown in Table 2.

In Table 2, "(3)*[1]" represents one obtained by subjecting the fluororesin (3) to the solvent extraction treatment, "(4)*[1]" represents one obtained by subjecting the fluororesin (4) to the solvent extraction treatment, and "(1)*[2]" represents a fluororesin having the same monomer unit composition as the fluororesin (1), but obtained by different production conditions.

As shown in the following results, the mold release films of Ex. 1, 2, 4 and 8 wherein F/Al was from 0.2 to 4, were less likely to contaminate other surfaces to which the release films were in contact.

TABLE 2

|  |  | Ex. | | | | | | |
|---|---|---|---|---|---|---|---|---|
|  |  | 1 | 2 | 3 | 4 | 5 | 8 | 9 |
| Fluororesin | | (1) | (2) | (3) | (3)*1 | (4) | (4)*1 | (1)*2 |
| F/Al | | 1.96 | 3.39 | 6.25 | 3.2 | 5.57 | 3.1 | 5.69 |
| Contamination evaluation | Number of tests | 10 | 7 | 3 | 7 | 4 | 7 | 4 |

INDUSTRIAL APPLICABILITY

The mold release film of the present invention is excellent in releasability at the time of encapsulating a semiconductor element with a curable resin, and it is possible to suppress contamination of the resin-encapsulation portion by the mold release film and to form a resin-encapsulation portion excellent in adhesion to an ink layer. Using the mold release film of the present invention, it is possible to produce a semiconductor package such as an integrated circuit having integrated a semiconductor device such as a transistor or diode.

This application is a continuation of PCT Application No. PCT/JP2014/079591, filed on Nov. 7, 2014, which is based upon and claims the benefit of priority from Japanese Patent Application No. 2013-231364 filed on Nov. 7, 2013, and Japanese Patent Application No. 2013-231365 filed on Nov. 7, 2013. The contents of those applications are incorporated herein by reference in their entireties.

REFERENCE SYMBOLS

1: semiconductor package, 10: substrate, 12: semiconductor chip (semiconductor element), 14: resin-encapsulation portion, 16: ink layer, 18: bonding wire, 19: cured product, 20: stationary upper mold, 22: cavity bottom member, 24: movable lower mold, 26: cavity, 30: mold release film, 40: curable resin, 50: upper mold, 52: lower mold, 54: cavity, 56: cavity surface, 58: substrate placement portion, 60: resin introducing portion, 62: resin placement portion, 64: plunger

What is claimed is:

1. A mold release film disposed on a cavity surface of a mold for producing a semiconductor package, the mold release film comprising
a first surface in contact with a curable resin with which a semiconductor element is encapsulated to form a resin-encapsulation portion, and
a second surface in contact with the cavity surface, wherein
at least the first surface is made of a fluororesin, and
the first surface has at least one of an atomic F/Al ratio measured by test method A of from 0.2 to 4 and an atomic F/(C+F+O) ratio measured by test method B of from 0.1 to 0.3:
the test method A measures the F/Al ratio by piling a first 1 mm thick cardboard, the mold release film, a 0.1 mm thick aluminum plate made of A1N30H-H18 material in accordance with JIS H4160, and a second 1 mm thick cardboard in this order to form a pile in which the first surface contacts the aluminum plate, pressing the pile for 5 minutes at 180° C. and under a pressure of 5 MPa, peeling the mold release film off from the aluminum plate, and analyzing the surface of the aluminum plate in contact with the mold release film by an X-ray photoelectron spectroscopy to obtain the F/Al ratio;
the test method B measures the F/(C+F+O) ratio by placing a 100 μm thick aluminum foil of a square shape with a size of 15 cm×15 cm on a 3 mm thick first metal plate of a square shape with a size of 15 cm×15 cm, placing a 100 mm thick spacer of a square shape with a size of 15 cm×15 cm having a rectangular hole of 10 cm×8 cm opened at its center on the aluminum foil, placing 2 g of an epoxy resin in the vicinity of the center of the hole, placing thereon the mold release film of a square shape with a size of 15 cm×15 cm so that the first surface is on the spacer side, and placing thereon a 3 mm thick second metal plate of a square shape with a size of 15 cm×15 cm to prepare a laminated sample; pressing the laminated sample for 5 minutes at 180° C. and under a pressure of 10 MPa to cure the epoxy resin; subsequently removing the second metal plate, the mold release film and the spacer, and analyzing the surface of the cured epoxy resin in contact with the mold release film by an X-ray photoelectron spectroscopy to obtain the F/(C+F+O) ratio, where the epoxy resin is an epoxy granular resin for encapsulating semiconductors with trade name SUMIKON EME G770H type F ver. GR manufactured by Sumitomo Bakelite Co., Ltd.

2. The mold release film according to claim 1, which has a thickness of from 16 to 200 μm.

3. The mold release film according to claim 1, which is a film of a single-layer structure made of the fluororesin.

4. The mold release film according to claim 1, wherein the fluororesin is a fluoroolefin polymer.

5. The mold release film according to claim 4, wherein the fluoroolefin polymer is an ethylene/tetrafluoroethylene copolymer.

6. The mold release film according to claim 5, wherein the ethylene/tetrafluoroethylene copolymer comprises a unit based on tetrafluoroethylene, a unit based on ethylene and a unit based on a third monomer other than tetrafluoroethylene and ethylene, and
a molar ratio of the unit based on tetrafluoroethylene to the unit based on ethylene in the ethylene/tetrafluoroethylene copolymer is from 80/20 to 40/60.

7. The mold release film according to claim 6, wherein the third monomer is hexafluoropropylene, perfluoro(propyl vinyl ether), (perfluoroethyl) ethylene or (perfluorobutyl) ethylene.

8. The mold release film according to claim 6, wherein the third monomer is (perfluorobutyl) ethylene.

9. The mold release film according to claim 5, wherein the ethylene/tetrafluoroethylene copolymer comprises a unit based on tetrafluoroethylene of from 40 to 69.7 mol %, a unit based on ethylene of from 30 to 59.7 mol %, and a unit based on a third monomer other than tetrafluoroethylene and ethylene of from 0.3 to 1.7 mol %, based on all units in the ethylene/tetrafluoroethylene copolymer.

10. The mold release film according to claim 5, wherein the ethylene/tetrafluoroethylene copolymer has a melt flow rate of from 2 to 40 g/10 min.

11. The mold release film according to claim 4, wherein the fluoroolefin polymer is a perfluoro(alkyl vinyl ether)/tetrafluoroethylene copolymer.

12. The mold release film according to claim 1, wherein the mold release film is made of a fluororesin film obtained by contacting a fluororesin film with a solvent to reduce components extractable by the solvent.

13. A process for producing a semiconductor package, the process comprising disposing the mold release film according to claim 1 on the cavity surface of the mold to be in contact with the curable resin so that the first surface faces the space in the cavity, forming the resin-encapsulation portion by disposing a substrate having the semiconductor element mounted thereon in the cavity, encapsulating the semiconductor element with the curable resin, and curing the curable resin such that the curable resin is in contact with the mold release film, thereby obtaining an encapsulated product comprising the substrate, the semiconductor element mounted on the substrate, and the resin-encapsulation portion for encapsulating the semiconductor element, and releasing the encapsulated product from the mold.

14. A process for producing a semiconductor package, the method comprising disposing the mold release film according to claim 1 on the cavity surface of the mold to be in contact with the curable resin, so that the first surface faces the space in the cavity, forming the resin-encapsulation portion by disposing a substrate having a semiconductor element mounted thereon in the cavity, encapsulating the semiconductor element with the curable resin, and curing the curable resin such that the curable resin is in contact with the mold release film, thereby obtaining an encapsulated product comprising the substrate, the semiconductor element mounted on the substrate, and the resin-encapsulation portion for encapsulating the semiconductor element, releasing the encapsulated product from the mold, and forming an ink layer by using an ink on the surface of the resin-encapsulation portion in contact with the mold release film.

15. The mold release film according to claim 1, wherein the first surface has the F/Al ratio measured by the test method A of from 0.2 to 4.

16. The mold release film according to claim 1, wherein the first surface has the F/(C+F+O) ratio measured by test method B of from 0.1 to 0.3.

17. The mold release film according to claim 1, which is a film of a multilayered structure.

18. The mold release film according to claim 1, wherein at least one of the first and second surfaces has an arithmetic mean roughness Ra of from 1.5 to 2.1 μm.

* * * * *